(12) United States Patent
Kim et al.

(10) Patent No.: US 11,171,136 B2
(45) Date of Patent: Nov. 9, 2021

(54) SEMICONDUCTOR DEVICES

(71) Applicant: Samsung Electronics Co., Ltd., Suwon-si (KR)

(72) Inventors: Sungmin Kim, Incheon (KR); Soonmoon Jung, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/849,238

(22) Filed: Apr. 15, 2020

(65) Prior Publication Data

US 2021/0035975 A1 Feb. 4, 2021

(30) Foreign Application Priority Data

Aug. 2, 2019 (KR) .................. 10-2019-0094521

(51) Int. Cl.
*H01L 27/092* (2006.01)
*H01L 29/06* (2006.01)
(Continued)

(52) U.S. Cl.
CPC .... *H01L 27/0922* (2013.01); *H01L 21/02529* (2013.01); *H01L 21/02532* (2013.01); *H01L 21/02603* (2013.01); *H01L 21/187* (2013.01); *H01L 21/28088* (2013.01); *H01L 21/82345* (2013.01); *H01L 21/823412* (2013.01); *H01L 21/823418* (2013.01); *H01L 21/823475* (2013.01); *H01L 29/0673* (2013.01);
(Continued)

(58) Field of Classification Search
CPC ........... H01L 27/0922; H01L 21/02529; H01L 21/02532; H01L 21/02603; H01L 21/187; H01L 21/28088; H01L 21/823418; H01L 21/82345; H01L 21/823475; H01L 29/0673; H01L 29/1608; H01L 29/161; H01L 29/41733; H01L 29/42392; H01L 29/4908; H01L 29/4966; H01L 29/65545; H01L 29/66742; H01L 29/78618; H01L 29/78684; H01L 29/78696
USPC ...................................................... 257/351
See application file for complete search history.

(56) References Cited

U.S. PATENT DOCUMENTS 6,790,732 B2 9/2004 Zahurak et al.
7,485,508 B2 2/2009 Dyer et al.
(Continued)

*Primary Examiner* — Tong-Ho Kim
(74) *Attorney, Agent, or Firm* — Harness, Dickey & Pierce, P.L.C.

(57) ABSTRACT

A semiconductor device includes a first transistor, a division pattern, and a second transistor sequentially stacked on a substrate. The first transistor includes a first gate structure, a first source/drain layer at each of opposite sides of the first gate structure, and first semiconductor patterns spaced apart from each other in a vertical direction. Each of the first semiconductor patterns extends through the first gate structure and contacts the first source/drain layer. The division pattern includes an insulating material. The second transistor includes a second gate structure, a second source/drain layer at each of opposite sides of the second gate structure, and second semiconductor patterns spaced apart from each other in the vertical direction. Each of the second semiconductor patterns extends through the second gate structure and contacts the second source/drain layer. The first source/drain layer does not directly contact the second source/drain layer.

20 Claims, 32 Drawing Sheets

(51) Int. Cl.
 *H01L 29/16*    (2006.01)
 *H01L 29/161*   (2006.01)
 *H01L 29/417*   (2006.01)
 *H01L 29/423*   (2006.01)
 *H01L 29/49*    (2006.01)
 *H01L 29/786*   (2006.01)
 *H01L 21/02*    (2006.01)
 *H01L 21/18*    (2006.01)
 *H01L 21/28*    (2006.01)
 *H01L 21/8234*   (2006.01)
 *H01L 29/66*    (2006.01)

(52) U.S. Cl.
 CPC ........ *H01L 29/161* (2013.01); *H01L 29/1608* (2013.01); *H01L 29/41733* (2013.01); *H01L 29/42392* (2013.01); *H01L 29/4908* (2013.01); *H01L 29/4966* (2013.01); *H01L 29/66545* (2013.01); *H01L 29/66742* (2013.01); *H01L 29/78618* (2013.01); *H01L 29/78684* (2013.01); *H01L 29/78696* (2013.01)

(56) References Cited

U.S. PATENT DOCUMENTS

| | | | |
|---|---|---|---|
| 9,613,844 | B2 | 4/2017 | Or-Bach et al. |
| 10,083,963 | B2 | 9/2018 | Goktepeli et al. |
| 10,157,909 | B2 | 12/2018 | Or-Bach et al. |
| 10,205,018 | B1 | 2/2019 | Li et al. |
| 2012/0223373 | A1 | 9/2012 | Kim et al. |
| 2018/0294284 | A1 | 10/2018 | Tarakji et al. |
| 2018/0323174 | A1 | 11/2018 | Mueller et al. |
| 2019/0131396 | A1* | 5/2019 | Zhang ............... H01L 21/30604 |
| 2020/0118891 | A1* | 4/2020 | Cheng ................... H01L 29/775 |

* cited by examiner

US 11,171,136 B2

SEMICONDUCTOR DEVICES

CROSS-REFERENCE TO RELATED APPLICATION

This application claims priority under 35 USC § 119 to Korean Patent Application No. 10-2019-0094521, filed on Aug. 2, 2019 in the Korean Intellectual Property Office (KIPO), the contents of which are herein incorporated by reference in their entirety.

BACKGROUND

1. Field

Example embodiments relate to semiconductor devices.

2. Description of the Related Art

As a method of stacking transistors in a vertical direction, after forming a first transistor, an insulating interlayer may be formed to cover the first transistor, and a second transistor may be formed on the insulating interlayer. However, the performance of the first transistor may be deteriorated by heat generated in the process for forming the second transistor. Alternatively, forming a first wafer including a first transistor and a first insulating interlayer and forming a second wafer including a second transistor and a second insulating interlayer, and they may be bonded by a wafer bonding method. However, during the bonding, misalignment may occur between the first and second wafers.

SUMMARY

Example embodiments provide a semiconductor device having enhanced characteristics.

According to example embodiments, there is provided a semiconductor device. The semiconductor device may include a first transistor on a substrate, a division pattern on the first transistor, and a second transistor on the division pattern. The first transistor may include a first gate structure, a first source/drain layer at each of opposite sides of the first gate structure, and first semiconductor patterns spaced apart from each other in a vertical direction that is substantially perpendicular to an upper surface of the substrate. Each of the first semiconductor patterns may extend through the first gate structure and contact the first source/drain layer. The division pattern may include an insulating material. The second transistor may include a second gate structure, a second source/drain layer at each of opposite sides of the second gate structure, and second semiconductor patterns spaced apart from each other in the vertical direction. Each of the second semiconductor patterns may extend through the second gate structure and contact the second source/drain layer. The first source/drain layer may not directly contact the second source/drain layer.

According to example embodiments, there is provided a semiconductor device. The semiconductor device may include a gate structure, a division pattern, a first source/drain layer, and a second source/drain layer. The gate structure may be formed on a substrate, and may extend in a first direction substantially parallel to an upper surface of the substrate. The first direction may cross a second direction. The second direction may be substantially parallel to the upper surface of the substrate. The gate structure may extend in a third direction and may include a lower portion and an upper portion that are divided at a height over the substrate. The third direction may be substantially perpendicular to the upper surface of the substrate. The division pattern may extend partially through the gate structure in the second direction on the substrate. The division pattern may include an insulating material. The division pattern may be arranged such that the lower portion and the upper portion of the gate structure may contact each other at an area where the division pattern is not formed. The height over the substrate, where the lower portion and the upper portion of the gate structure may be divided, may correspond to a central portion of the division pattern in the third direction. The first source/drain layer may be formed at each of opposite sides in the second direction of the gate structure and may be under the division pattern. The second source/drain layer may be formed at each of opposite sides in the second direction of the gate structure and may be over the division pattern. The first and second source/drain layers may be spaced apart from each other by the division pattern in a third direction substantially perpendicular to the upper surface of the substrate. The lower portion of the gate structure and the first source/drain layer may form a first transistor. The upper portion of the gate structure and the second source/drain layer may form a second transistor.

According to example embodiments, there is provided a semiconductor device. The semiconductor device may include a first insulating interlayer on a substrate; a gate structure extending in a first direction substantially parallel to an upper surface of the substrate on the first insulating interlayer; first source/drain layers contacting lower portions of opposite sidewalls, respectively, of the gate structure in a second direction substantially parallel to the upper surface of the substrate and crossing the first direction on the first insulating interlayer; a first wiring structure contacting one of the first source/drain layers in the first insulating interlayer; a division pattern extending through the gate structure to contact upper surfaces of the first source/drain layers; second source/drain layers contacting upper portions of opposite sidewalls, respectively, in the second direction of the gate structure; a connection plug extending through one of the second source/drain layers, the division pattern and one of the first source/drain layers; a second insulating interlayer on the gate structure, the connection plug and the second source/drain layers; and a second wiring structure contacting one of the second source/drain layers in the second insulating interlayer, the second wiring structure.

In semiconductor devices according to example embodiments, upper and lower transistors may be aligned with each other. Characteristics of each of the transistors may not be deteriorated due to the heat, and thus the transistors may have enhanced electrical characteristics.

DESCRIPTION OF EMBODIMENTS

Figure 1:
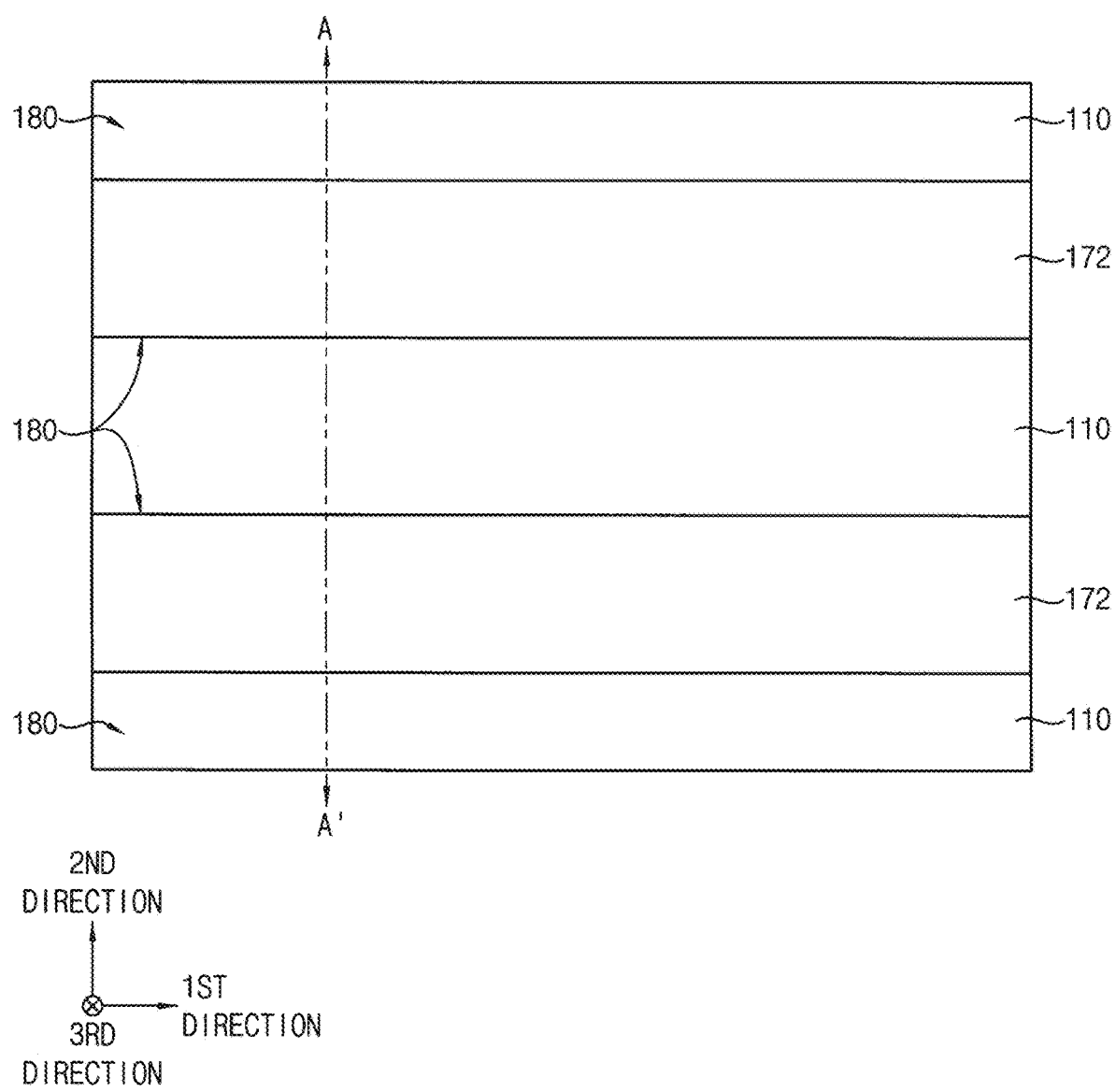
FIGS. 1 to 20 are plan views and cross-sectional views illustrating a method of manufacturing a semiconductor device in accordance with example embodiments.

FIGS. 1 to 20 are plan views and cross-sectional views illustrating a method of manufacturing a semiconductor device in accordance with example embodiments. FIGS. 1 and 3 are the plan views, and FIGS. 2 and 4 to 20 are the cross-sectional views.

FIGS. 2, 4, 12 and 15 are cross-sectional views taken along lines A-A' of corresponding plan views, FIGS. 5, 7, 8, 10, 13, 16, 18 and 20 are cross-sectional views taken along lines B-B' of corresponding plan views, and FIGS. 6, 9, 11, 14, 17 and 19 are cross-sectional views taken along lines C-C' of corresponding plan views.

Hereinafter in the specifications (not in the claims), two directions substantially parallel to an upper surface of a first substrate 100 and crossing each other may be referred to as first and second directions, respectively, and a direction substantially perpendicular to the upper surface of the first substrate 100 may be referred to as a third direction. In example embodiments, the first and second directions may be substantially perpendicular to each other.

Figure 2:
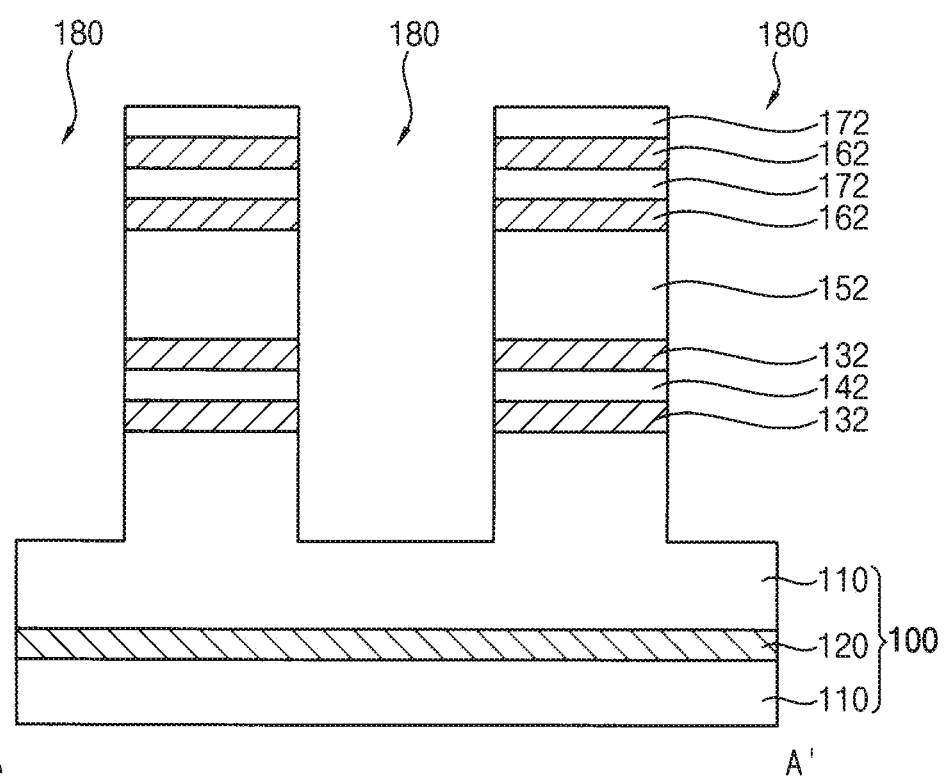
Figure 2:
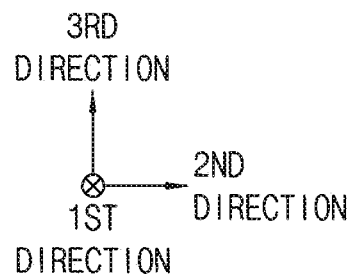
Figure 3:
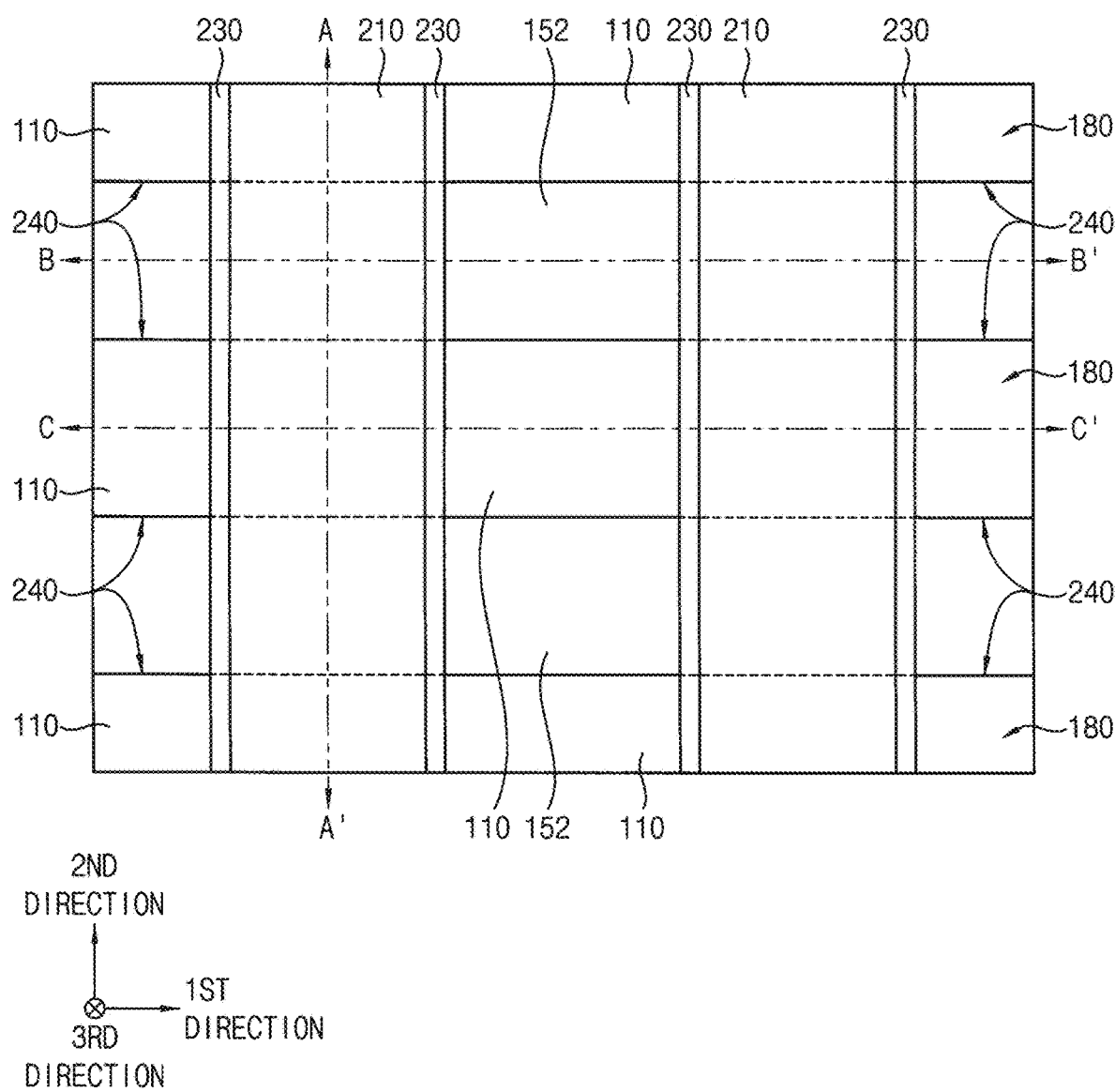
Figure 4:
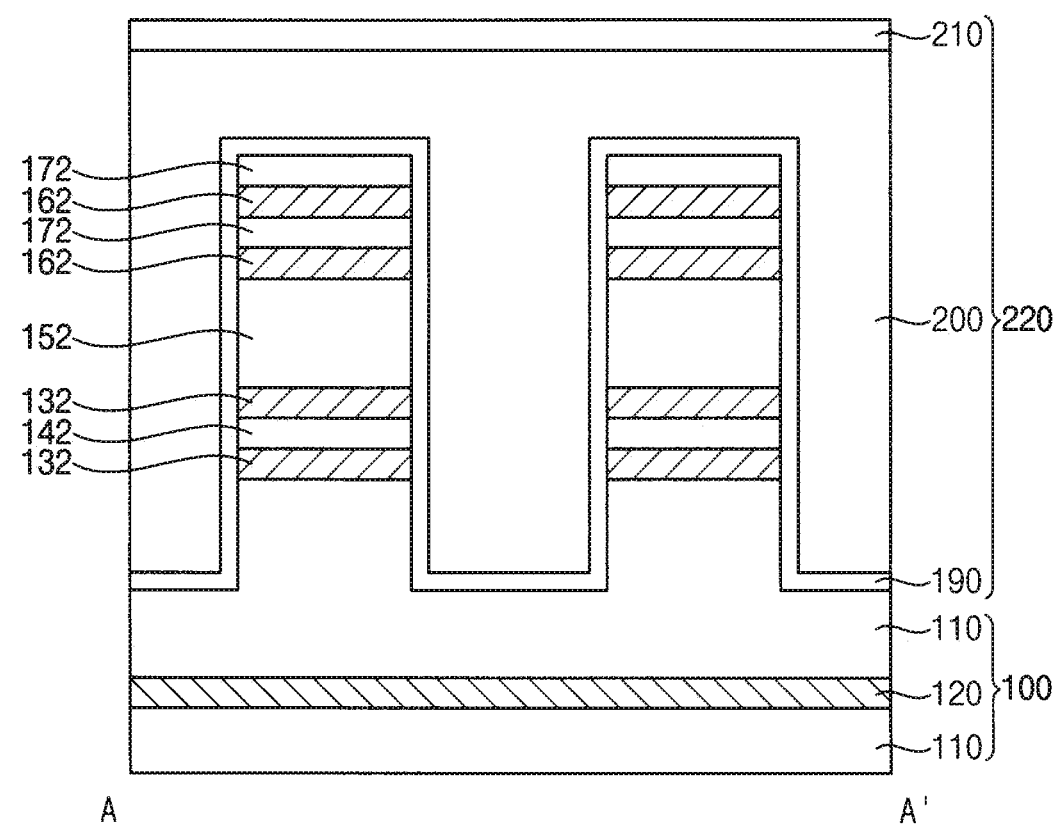
Figure 4:
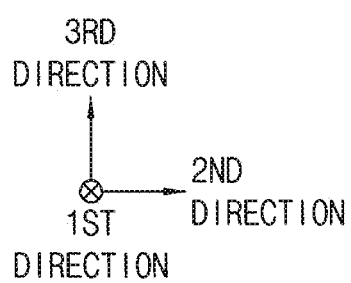
Figure 5:
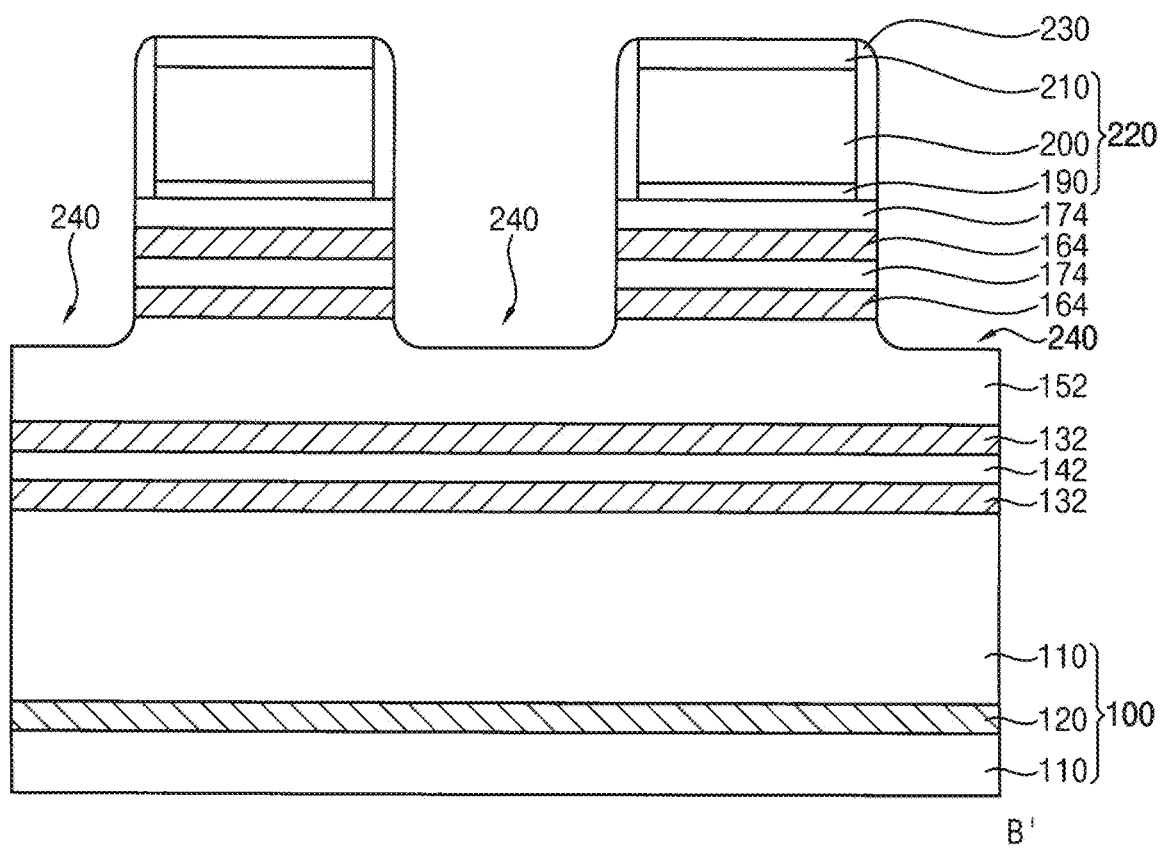
Figure 5:
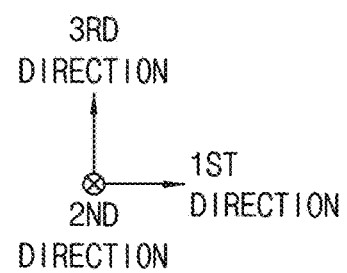
Figure 6:
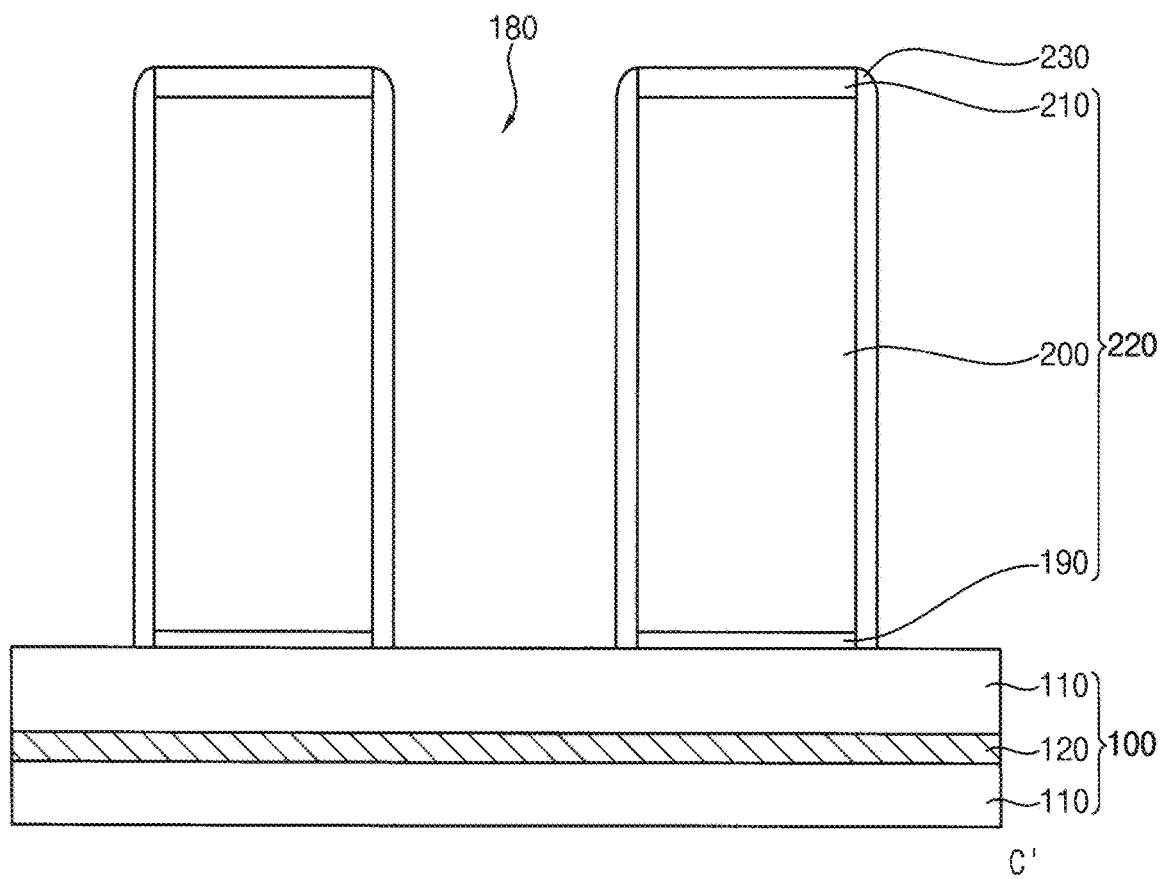
Figure 6:
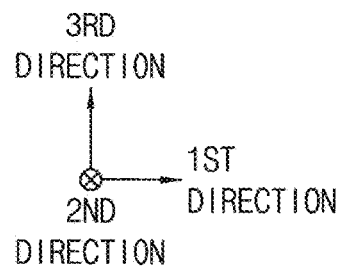

Referring to FIGS. 1 and 2, a sacrificial layer and a semiconductor layer may be alternately and repeatedly stacked on the first substrate 100, a division layer may be formed on an uppermost one of the sacrificial layers, and the sacrificial layer and the semiconductor layer may be alternately and repeatedly stacked on the division layer.

The first substrate 100 may include a semiconductor material, e.g., silicon, germanium, silicon-germanium, etc., or III-V semiconductor compounds, e.g., GaP, GaAs, GaSb, etc. In some embodiments, the first substrate 100 may be a semiconductor-on-insulator substrate, such as a silicon-on-insulator (SOI) substrate or a germanium-on-insulator (GOI) substrate.

In the drawings, an SOI substrate is formed as the first substrate 100, however, inventive concepts may not be limited thereto. The SOI substrate may include a bulk substrate 110, an insulation layer 120, and the bulk substrate 110 sequentially stacked. The bulk substrate 110 may include the semiconductor material, and the insulation layer 120 may include a nitride, e.g., silicon nitride.

In the drawings, two sacrificial layers are formed at two levels, respectively, under and over the division layer, however, inventive concepts may not be limited thereto. That is, one or a plurality of sacrificial layers may be formed at one or a plurality of levels, respectively, under and over the division layer.

In example embodiments, the sacrificial layer and the semiconductor layer may be formed by a selective epitaxial growth (SEG) process using the bulk substrate 110 included in the first substrate 100 as a seed.

In an example embodiment, the sacrificial layer may be formed by an SEG process using a silicon source gas, e.g., dichlorosilane ($SiH_2Cl_2$) gas and a germanium source gas, e.g., germane ($GeH_4$) gas, and thus a single crystalline silicon-germanium layer may be formed. In an example embodiment, the semiconductor layer may be formed by an SEG process using a silicon source gas, e.g., disilane ($Si_2H_6$) gas, and thus a single crystalline silicon layer may be formed.

The division layer may include an oxide, e.g., silicon oxide.

The semiconductor layers, the sacrificial layers, the division layer, and an upper portion of the bulk substrate 110 may be etched by an etching process using an etching mask to form a trench 180 extending in the first direction on the first substrate 100.

Thus, a protrusion may be formed to extend in the first direction on the first substrate 100, and a plurality of protrusions may be formed to be spaced apart from each other in the second direction. A line structure including second sacrificial lines 132 and second semiconductor lines 142 alternately and repeatedly stacked, a division pattern 152 on an uppermost one of the second sacrificial lines 132, and first sacrificial lines 162 and first semiconductor lines 172 alternately and repeatedly stacked on the division pattern 152 may be formed on each of the plurality of protrusions on the first substrate 100. The division pattern 152 may be formed of an insulating material.

Referring to FIGS. 3 to 6, a first dummy gate structure 220 may be formed on the first substrate 100 to partially cover the line structure.

Particularly, a first dummy gate insulation layer, a first dummy gate electrode layer, and a first dummy gate mask layer may be sequentially formed on the first substrate 100 having the line structure, and the first dummy gate mask layer may be etched by an etching process using an etching mask extending in the second direction to form a first dummy gate mask 210.

The first dummy gate insulation layer may include an oxide, e.g., silicon oxide, the first dummy gate electrode layer may include, e.g., polysilicon, and the first dummy gate mask layer may include a nitride, e.g., silicon nitride.

The first dummy gate electrode layer and the first dummy gate insulation layer may be etched using the first dummy gate mask 210 as an etching mask to form a first dummy gate electrode 200 and a first dummy gate insulation pattern 190, respectively. The first dummy gate insulation pattern 190, the first dummy gate electrode 200, and the first dummy gate mask 210 sequentially stacked on the first substrate 100 and the line structure may form a first dummy gate structure 220.

In example embodiments, the first dummy gate structure 220 may extend in the second direction, and a plurality of first dummy gate structures 220 may be formed to be spaced apart from each other in the first direction. A first portion of the first dummy gate structure 220 on the line structure may have a thickness less than that of a second portion of the first dummy gate structure 220 on a portion of the first substrate 100 having no protrusion thereon, and thus the second portion may have a thickness greater than that of the first portion. Additionally, the first dummy gate structure 220 may cover an upper surface and a sidewall in the second direction of a portion of the line structure and a sidewall in the second direction of a portion of the protrusion of the first substrate 100.

A first gate spacer 230 may be formed to cover each of opposite sidewalls in the first direction of the first dummy gate structure 220, and the line structure may be etched using the first dummy gate structure 220 and the first gate spacer 230 as an etching mask to form a first recess 240 exposing an upper surface of the division pattern 152. The first gate spacer 230 may include a nitride, e.g., silicon nitride.

Thus, the first semiconductor lines 172 and the first sacrificial lines 162 may be transformed into a plurality of first semiconductor patterns 174 and a plurality of first sacrificial patterns 164, respectively, under the first dummy gate structure 220 and the first gate spacer 230.

Hereinafter, an upper portion of the first dummy gate structure 220 higher than an upper surface of the division pattern 152, a portion of the first gate spacer 230 on each of opposite sidewalls of the upper portion of the first dummy gate structure 220, and the first semiconductor patterns 174 and the first sacrificial patterns 164 alternately stacked thereunder may be referred to as a first structure. In example embodiments, the first structure may extend in the second direction, and a plurality of first structures may be formed to be spaced apart from each other in the first direction.

Figure 7:
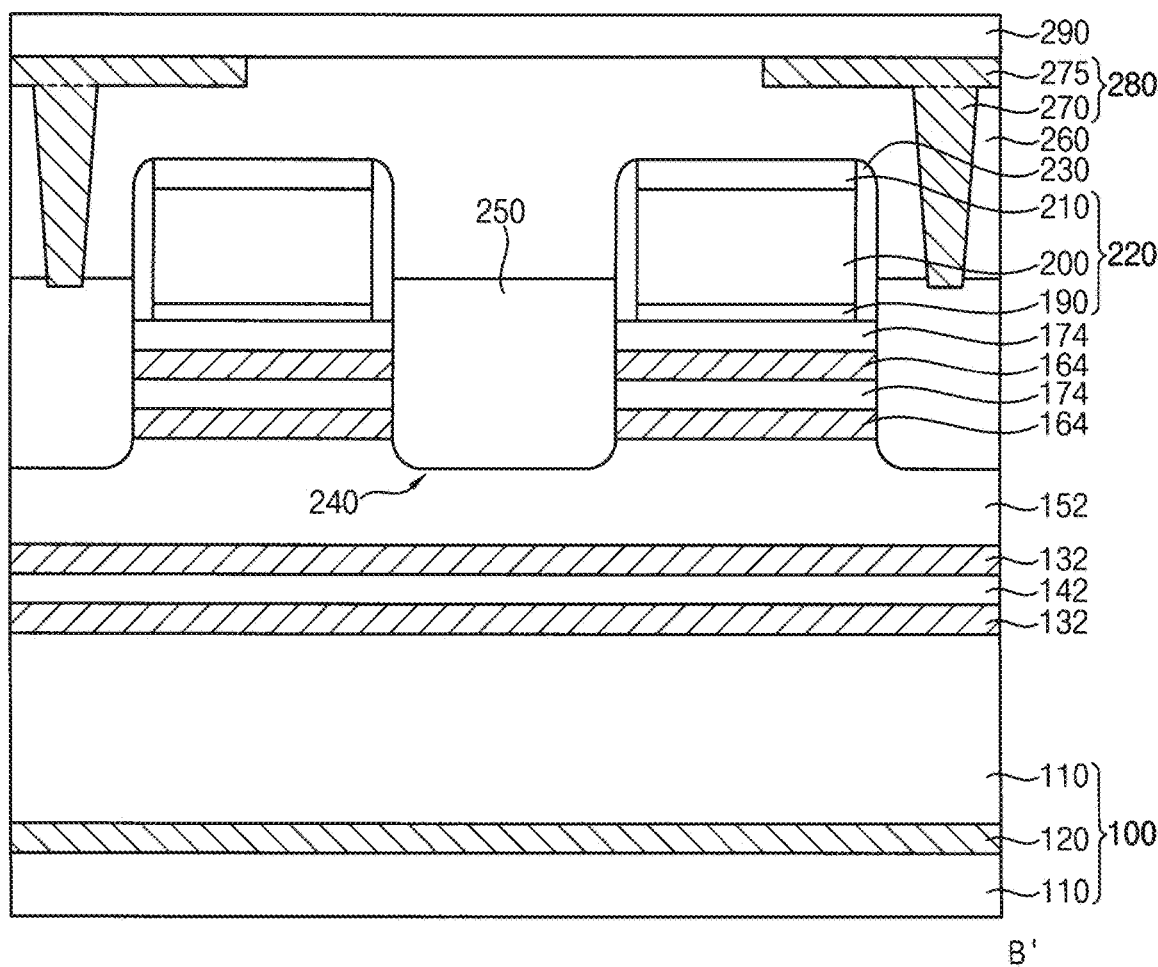

Referring to FIG. 7, a first source/drain layer 250 may be formed on the upper surface of the division pattern 152 exposed by the first recess 240.

In example embodiments, the first source/drain layer 250 may be formed by an SEG process using sidewalls of the first semiconductor patterns 174 and the first sacrificial patterns 164 exposed by the first recess 240 as a seed.

In example embodiments, the SEG process may be performed using a silicon source gas such as dichlorosilane ($SiH_2Cl_2$) gas, a germanium source gas such as germane ($GeH_4$) gas, and a p-type impurity source gas such as diborane ($B_2H_6$) gas to form a single crystalline silicon-germanium (SiGe) layer doped with p-type impurities. The first source/drain layer 250 may serve as a source/drain of a PMOS transistor.

In example embodiments, the first source/drain layer 250 may be formed on each of opposite sidewalls of the first structure, and may contact the sidewalls of the first sacrificial patterns 164 and the first semiconductor patterns 174 and a lower portion of an outer sidewall of the first gate spacer 230.

A first insulating interlayer 260 may be formed on the first substrate 100 to cover the first structure, the first source/drain layer 250, a lower portion of the first dummy gate structure 220, and a portion of the first gate spacer 230 on a sidewall of the lower portion of the first dummy gate structure 220, and a first wiring structure 280 may be formed to extend through the first insulating interlayer 260 to contact the first source/drain layer 250. In example embodiments, the first wiring structure 280 may contact some of the first source/drain layers 250, and in the drawings, two first wiring structures 280 are shown.

The first wiring structure 280 may be formed by, e.g., a dual damascene process, and may include a first via 270 contacting the first source/drain layer 250, and a first wiring 275 on the first via 270. The first via 270 and the first wiring 275 may include a metal, a metal nitride, a metal silicide, or doped polysilicon.

A second insulating interlayer 290 may be formed on the first wiring structure 280 and the first insulating interlayer 260. Each of the first and second insulating interlayers 260 and 290 may include an oxide, e.g., silicon oxide, and may be merged with each other.

Figure 8:
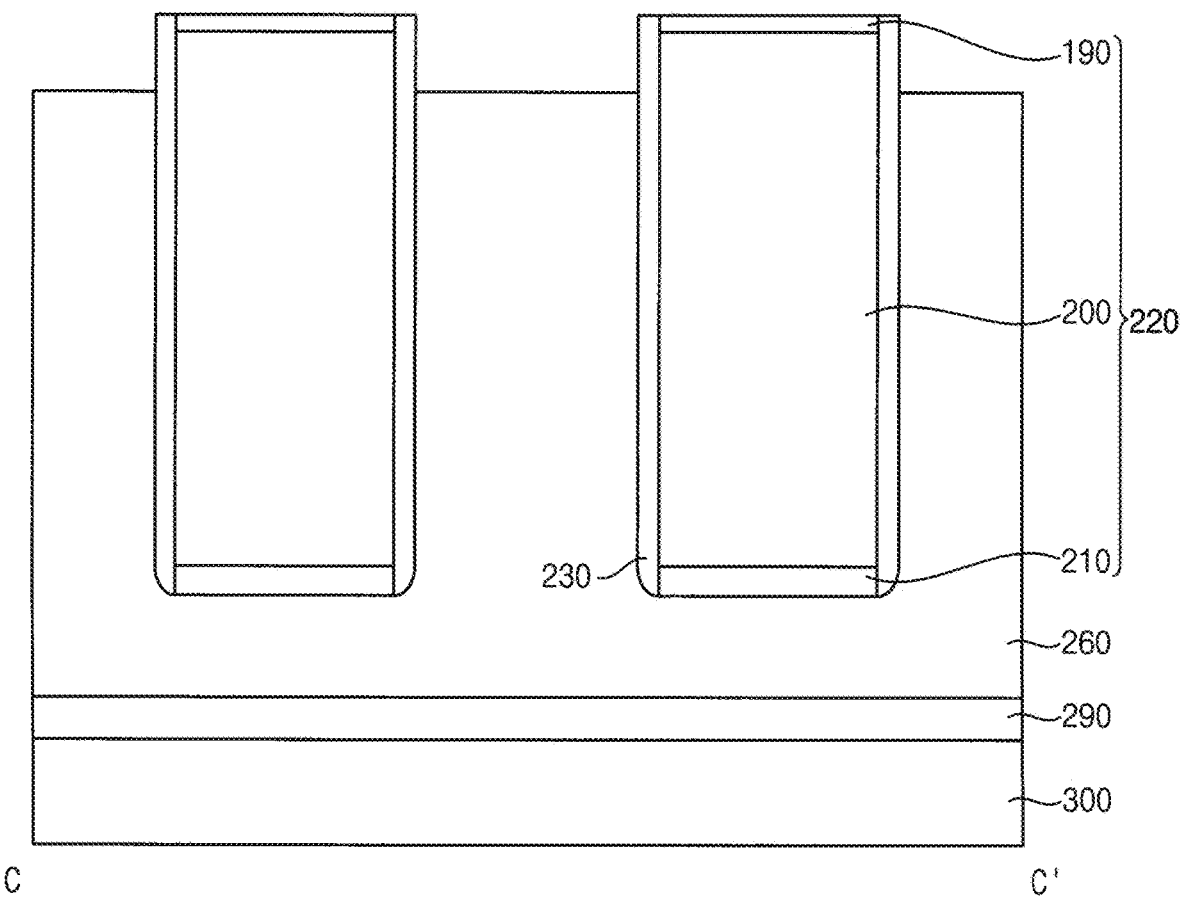
Figure 9:
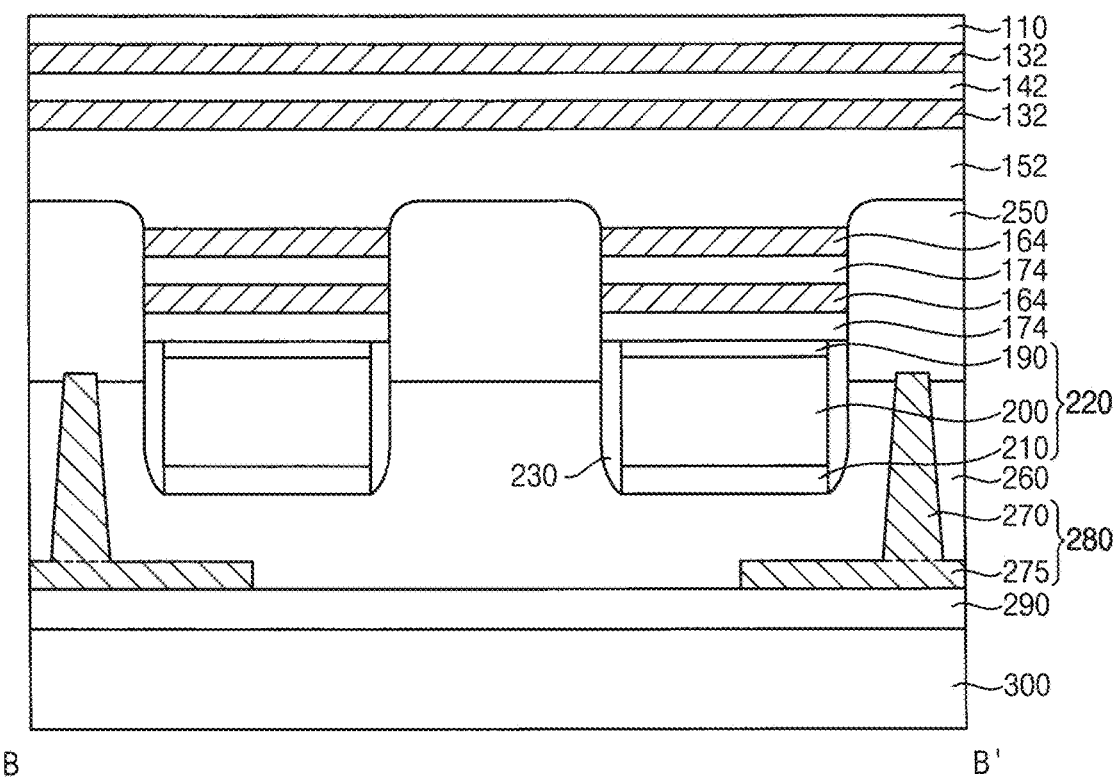
Figure 9:
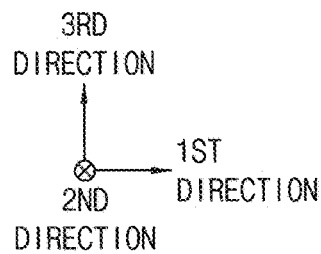

Referring to FIGS. 8 and 9, the first substrate 100 may be turned over so that the second insulating interlayer 290 may face downward, and may be bonded onto a second substrate 300. Hereinafter, lower and upper portions of various structures previously illustrated may be referred to as upper and lower portions, respectively, thereof. The second substrate 300 may include a semiconductor material, e.g., silicon, germanium, silicon-germanium, or III-V semiconductor compounds, e.g., GaP, GaAs, GaSb, etc.

The first substrate 100 and a portion of the first insulating interlayer 260 may be removed by, e.g., a grinding process and/or an etching process. In an example embodiment, an upper portion of the bulk substrate 110 may be removed by a grinding process until the insulation layer 120 may be exposed, and the insulation layer 120, a lower portion of the bulk substrate 110, and the portion of the first insulating interlayer 260 may be removed by an etching process.

The etching process may be performed until a portion of the first dummy gate structure 220, particularly, a portion of the first dummy gate structure 220 under a portion of the first substrate 100 where the line structure is not formed may be exposed, and thus a portion of the bulk substrate 110 having a linear shape extending in the first direction may remain under a portion of the first substrate 100 where the line structure is formed.

By the etching process, an upper surface of the first dummy gate insulation pattern 190 in the first dummy gate structure 220 and an upper surface and an upper sidewall of the first gate spacer 230 may be exposed.

Figure 10:
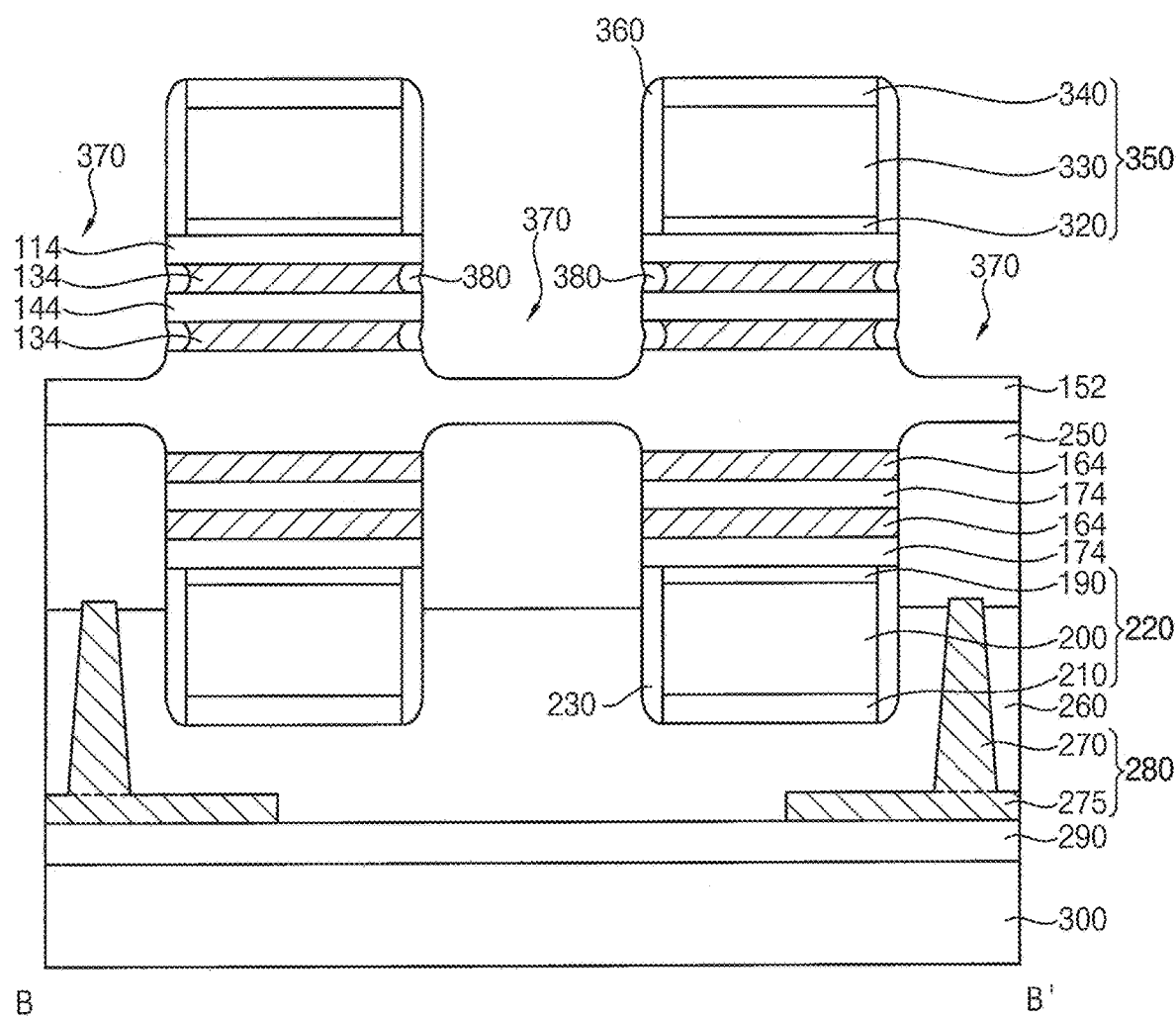
Figure 11:
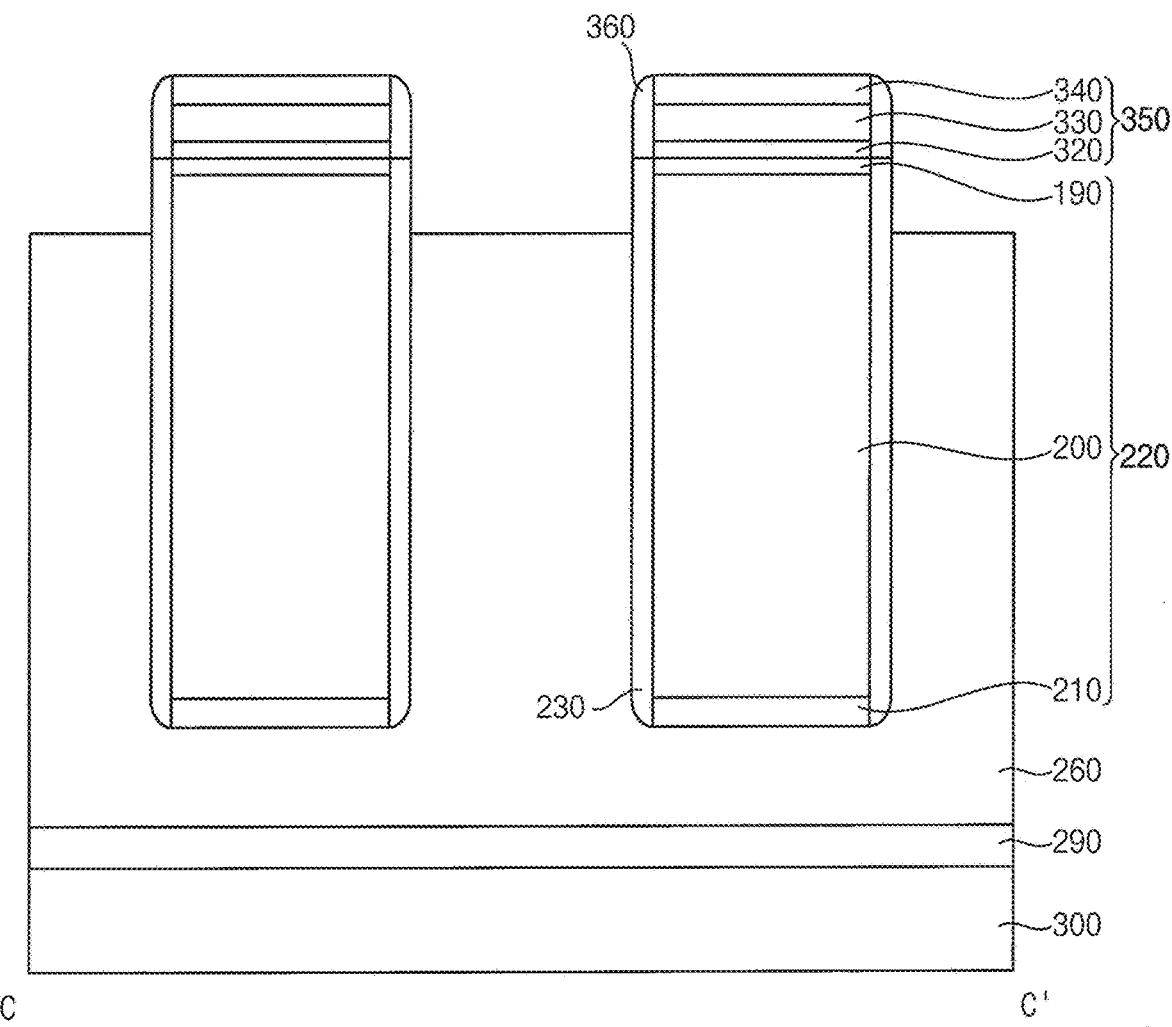

Referring to FIGS. 10 and 11, a second dummy gate structure 350 extending in the second direction and a second gate spacer 360 on each of opposite sidewalls in the first direction of the second dummy gate structure 350 may be formed on the exposed first dummy gate structure 220, the first gate spacer 230, and the remaining bulk substrate 110.

Particularly, a second dummy gate insulation layer, a second dummy gate electrode layer and a second dummy gate mask layer may be sequentially formed on the bulk substrate 110, the first dummy gate structure 220, the first gate spacer 230, and the first insulating interlayer 260, and may be etched by an etching process using an etching mask extending in the second direction to form a second dummy gate mask 340.

The second dummy gate mask layer and the second dummy gate insulation layer may be etched using the second dummy gate mask 340 as an etching mask to form a second dummy gate electrode 330 and a second dummy gate insulation pattern 320, respectively. The second dummy gate insulation pattern 320, the second dummy gate electrode 330, and the second dummy gate mask 340 sequentially stacked on the bulk substrate 110 and the first dummy gate structure 220 may form the second dummy gate structure 350 extending in the second direction, and a plurality of second dummy gate structures 350 may be formed to be spaced apart from each other in the first direction. In example embodiments, the second dummy gate structure 350 may be aligned with the first dummy gate structure 220 in the third direction.

The second gate spacer 360 covering each of opposite sidewalls in the first direction of the second dummy gate structure 350 may be formed to be aligned with the first gate spacer 230 in the third direction, and the bulk substrate 110 and the line structure may be etched using the second dummy gate structure 350 and the second gate spacer 360 as an etching mask to form a second recess 370 exposing an upper surface of the division pattern 152. The second gate spacer 360 may include a material substantially the same as that of the first gate spacer 230, and may be merged therewith.

Thus, the second sacrificial lines 132 and the second semiconductor lines 142 under the second dummy gate structure 350 and the second gate spacer 360 may be transformed into second sacrificial patterns 134 and second semiconductor patterns 144, respectively. The bulk substrate 110 under the second dummy gate structure 350 and the second gate spacer 360 may be transformed into a third semiconductor pattern 114, which may include a material substantially the same as that of the second semiconductor pattern 144, e.g., single crystalline silicon.

Hereinafter, for the convenience of explanation, the second dummy gate structure 350, the second gate spacer 360 on each of opposite sidewalls thereof, and the third semiconductor pattern 114, the second sacrificial patterns 134 and the second semiconductor patterns 144 stacked thereunder may be referred to as a second structure. In example embodiments, the second structure may extend in the second direction, and a plurality of second structures may be formed to be spaced apart from each other in the first direction.

Each of opposite sidewalls in the first direction of each of the second sacrificial patterns 134 may be removed to form a gap, and a first inner spacer 380 may be formed in the gap. The first inner spacer 380 may include a nitride, e.g., silicon nitride, and may include a cross-section in the first direction having various shapes, e.g., a horseshoe, a rectangular shape with rounded corners, which may have a recess on an outer sidewall thereof, etc.

Figure 12:
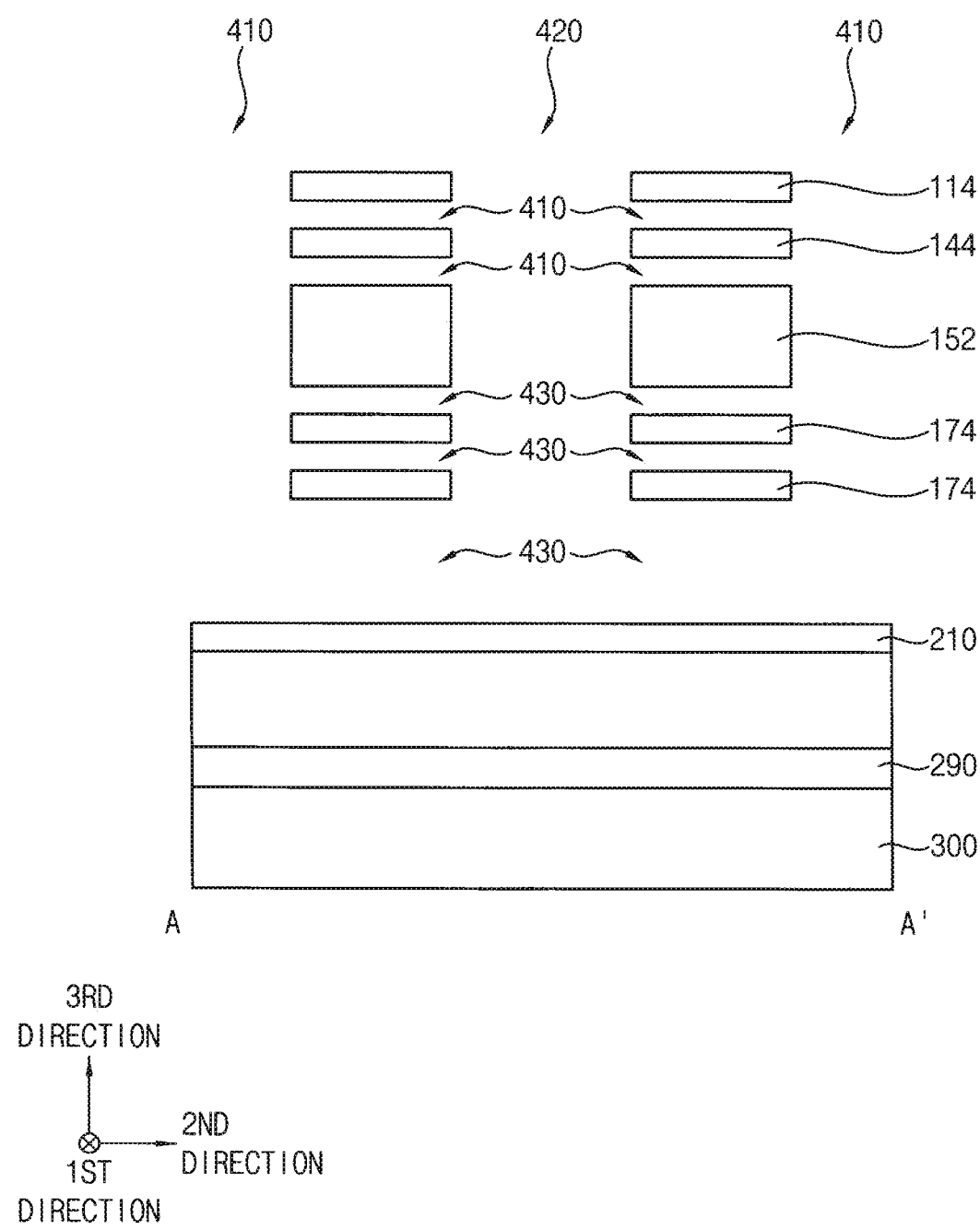
Figure 13:
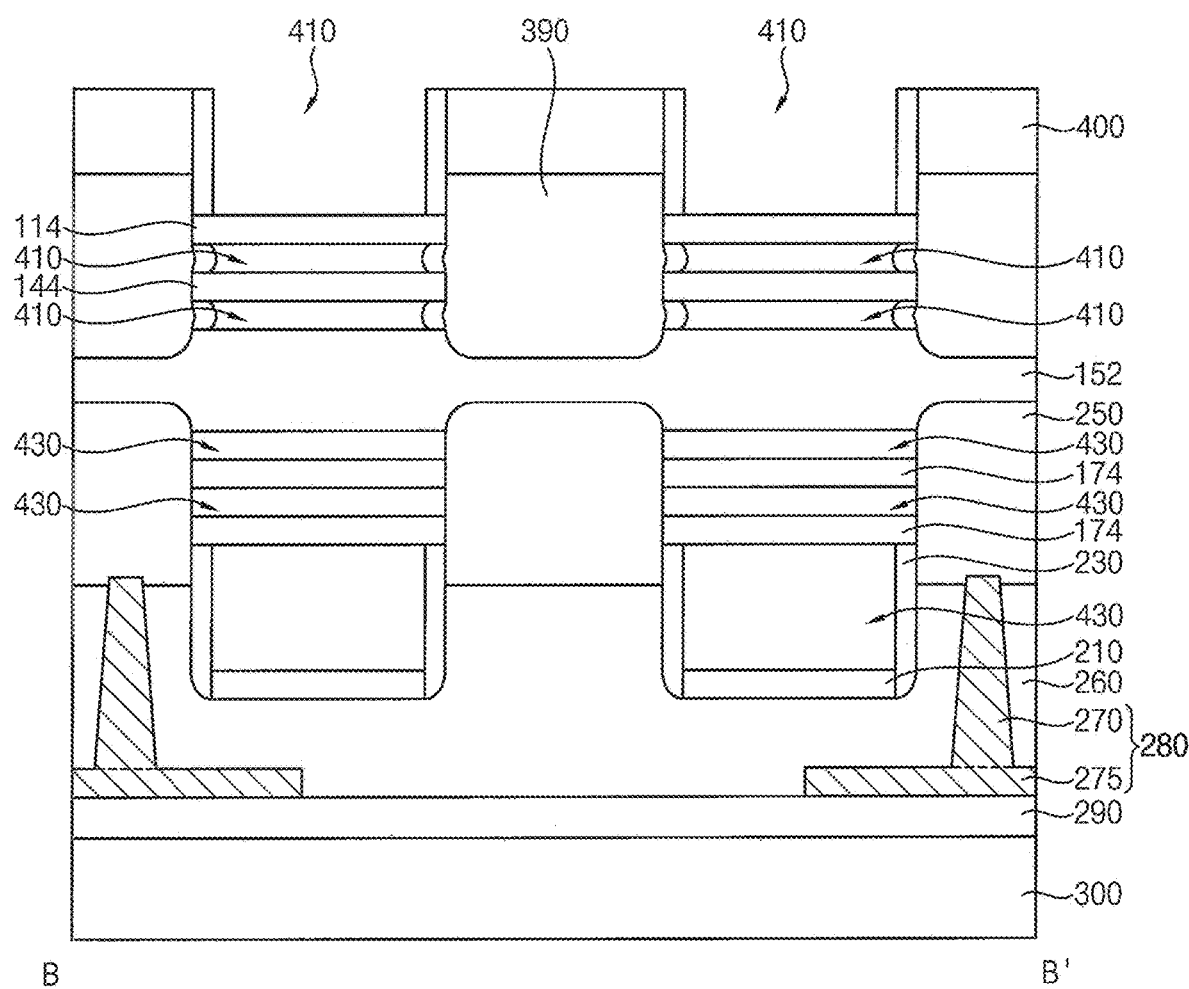
Figure 14:
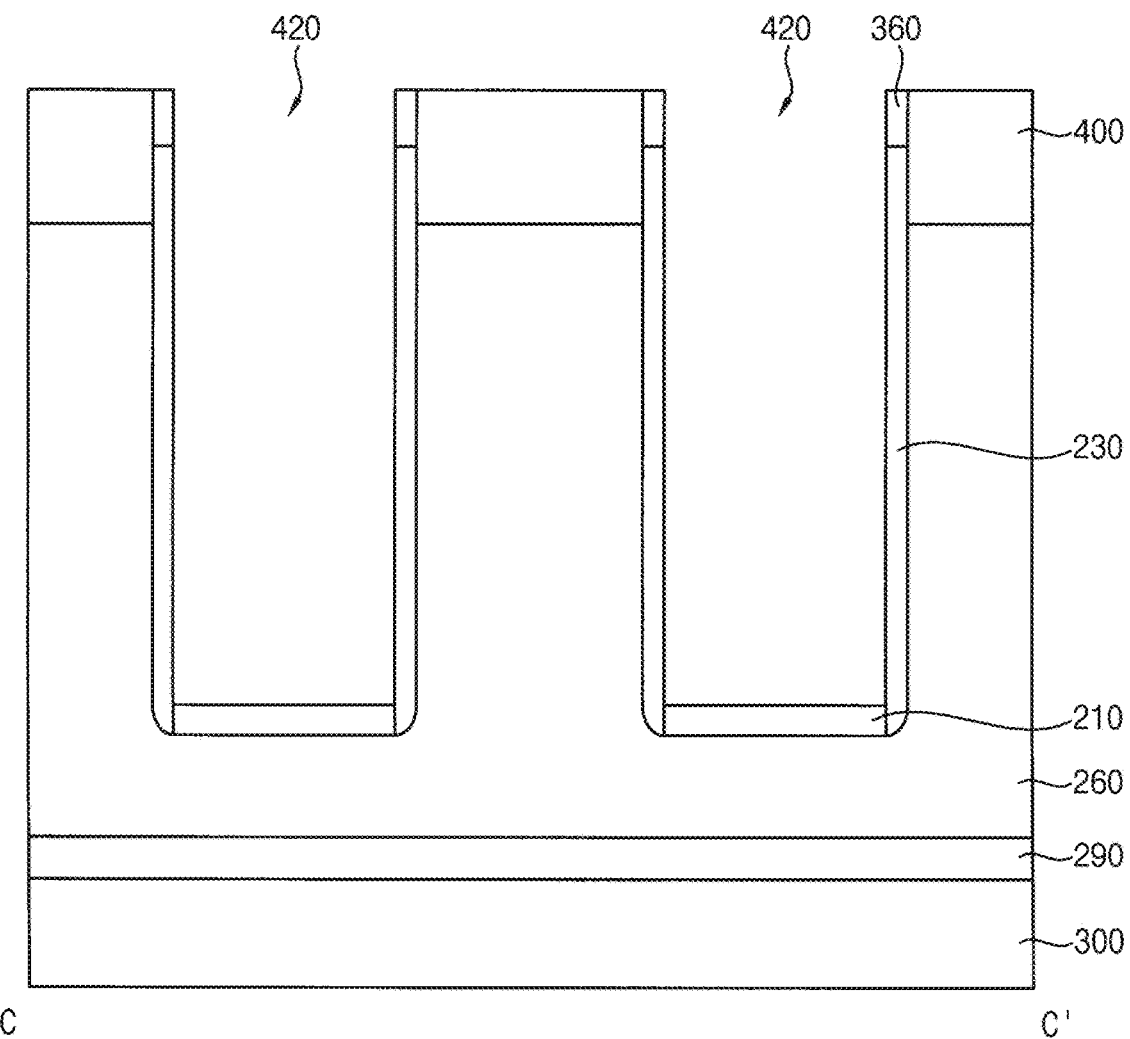

Referring to FIGS. 12 to 14, a second source/drain layer 390 may be formed on the division pattern 152 exposed by the second recess 370.

In example embodiments, the second source/drain layer 390 may be formed by an SEG process using sidewalls of the second and third semiconductor patterns 144 and 114 and the second sacrificial patterns 134 exposed by the second recess 370 as a seed.

In example embodiments, the SEG process may be performed using a silicon source gas such as disilane ($Si_2H_6$), a carbon source gas such as $SiH_3CH_3$, and an n-type impurity source gas such as $POCl_3$, $P_2O_5$, etc., to form a single crystalline silicon carbide (SiC) layer doped with n-type impurities. Alternatively, the SEG process may be performed using the silicon source gas and the n-type impurity source gas to form a single crystalline silicon layer doped with n-type impurities. Thus, the second source/drain layer 390 may serve as a source/drain of an NMOS transistor.

In example embodiments, the second source/drain layer 390 may be formed on each of opposite sidewalls in the first direction of the second structure, and may contact the sidewalls of the second sacrificial patterns 134 and the second and third semiconductor patterns 144 and 114, an outer sidewall of the first inner spacer 380, and a lower portion of an outer sidewall of the second gate spacer 360.

A third insulating interlayer 400 may be formed on the second structure, the second source/drain layer 390, an upper portion of the first dummy gate structure 220, and a portion of the first gate spacer 230 on a sidewall of the upper portion of the first dummy gate structure 220, and the division pattern 152, and may be planarized until an upper surface of the second dummy gate electrode 330 of the second structure may be exposed. During the planarization process, the second dummy gate mask 340 and an upper portion of the second gate spacer 360 may be also removed.

The planarization process may include a chemical mechanical polishing (CMP) process and/or an etch back process.

The exposed second dummy gate electrode 330, the second dummy gate insulation pattern 320 and the second sacrificial patterns 134 thereunder may be removed by an etching process to form a first opening 410 exposing an inner sidewall of the second gate spacer 360, an inner sidewall of the first inner spacer 380, surfaces of the second and third semiconductor patterns 144 and 114, and an upper surface of the division pattern 152.

During the etching process, the second dummy gate electrode 330 and the second dummy gate insulation pattern 320 may be removed not only in a first area where the line structure is formed but also in a second area adjacent thereto in the second direction, and in the second area, the first dummy gate insulation pattern 190 and the first dummy gate electrode 200 under the second dummy gate insulation pattern 320 may be also removed to form a second opening 420.

As the second opening 420 is formed, in the first area, the first sacrificial patterns 164, the first dummy gate insulation pattern 190 and the first dummy gate electrode 200 under the division pattern 152 may be also removed to form a third opening 430 exposing an inner sidewall of the first gate spacer 230, surfaces of the first semiconductor patterns 174, and a lower surface of the division pattern 152.

Figure 15:
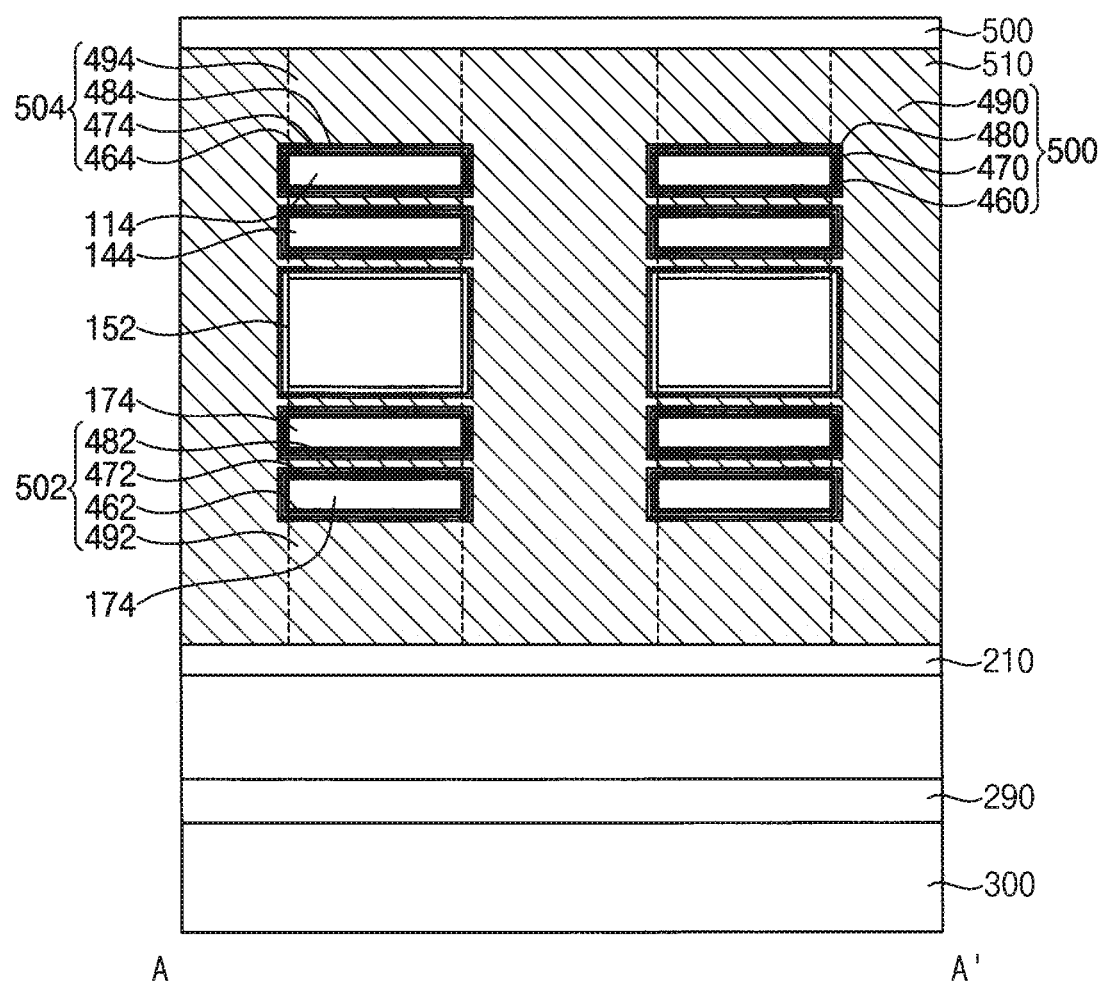
Figure 15:
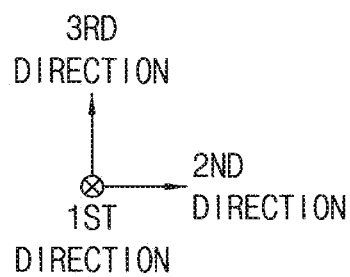
Figure 16:
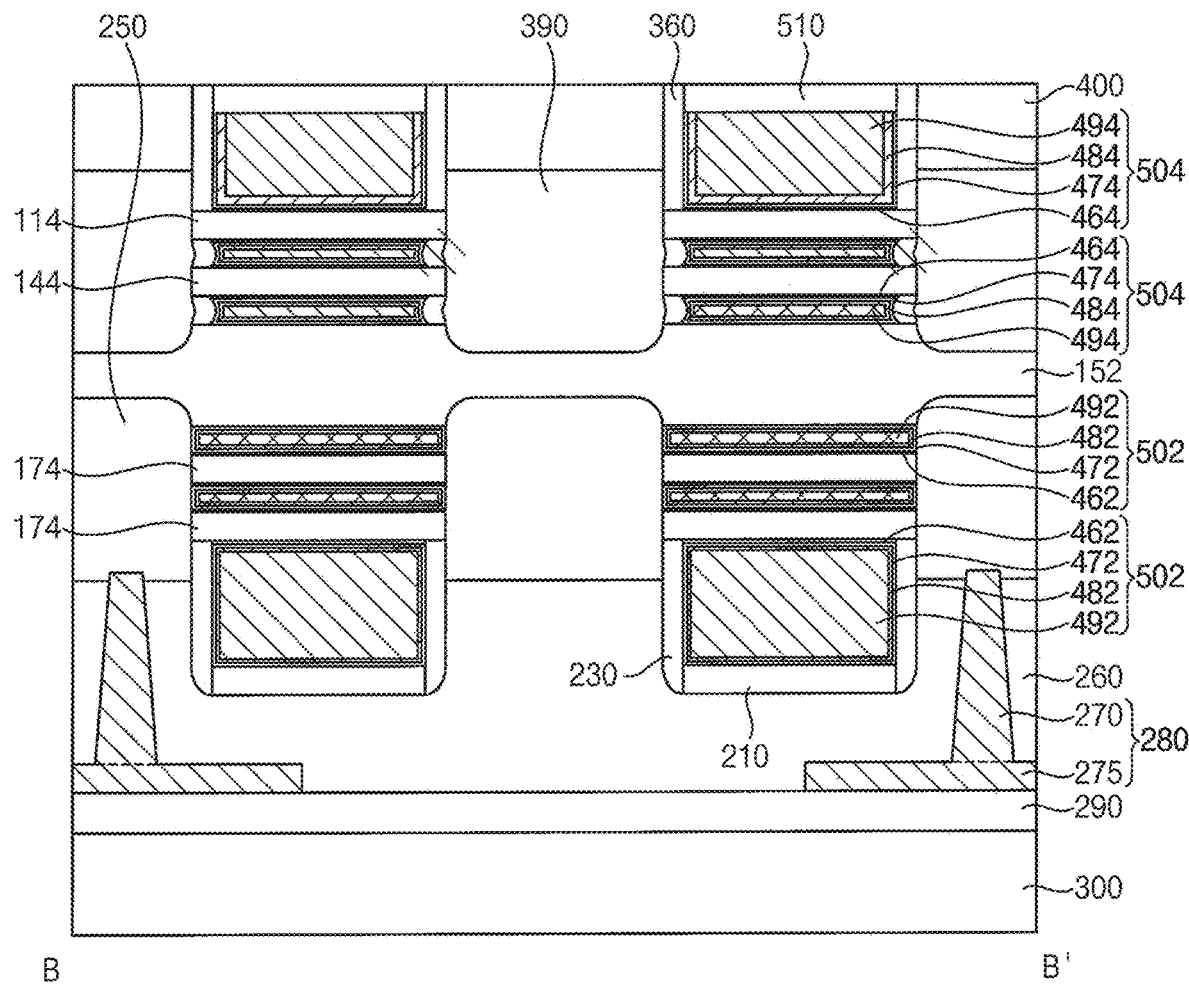
Figure 17:
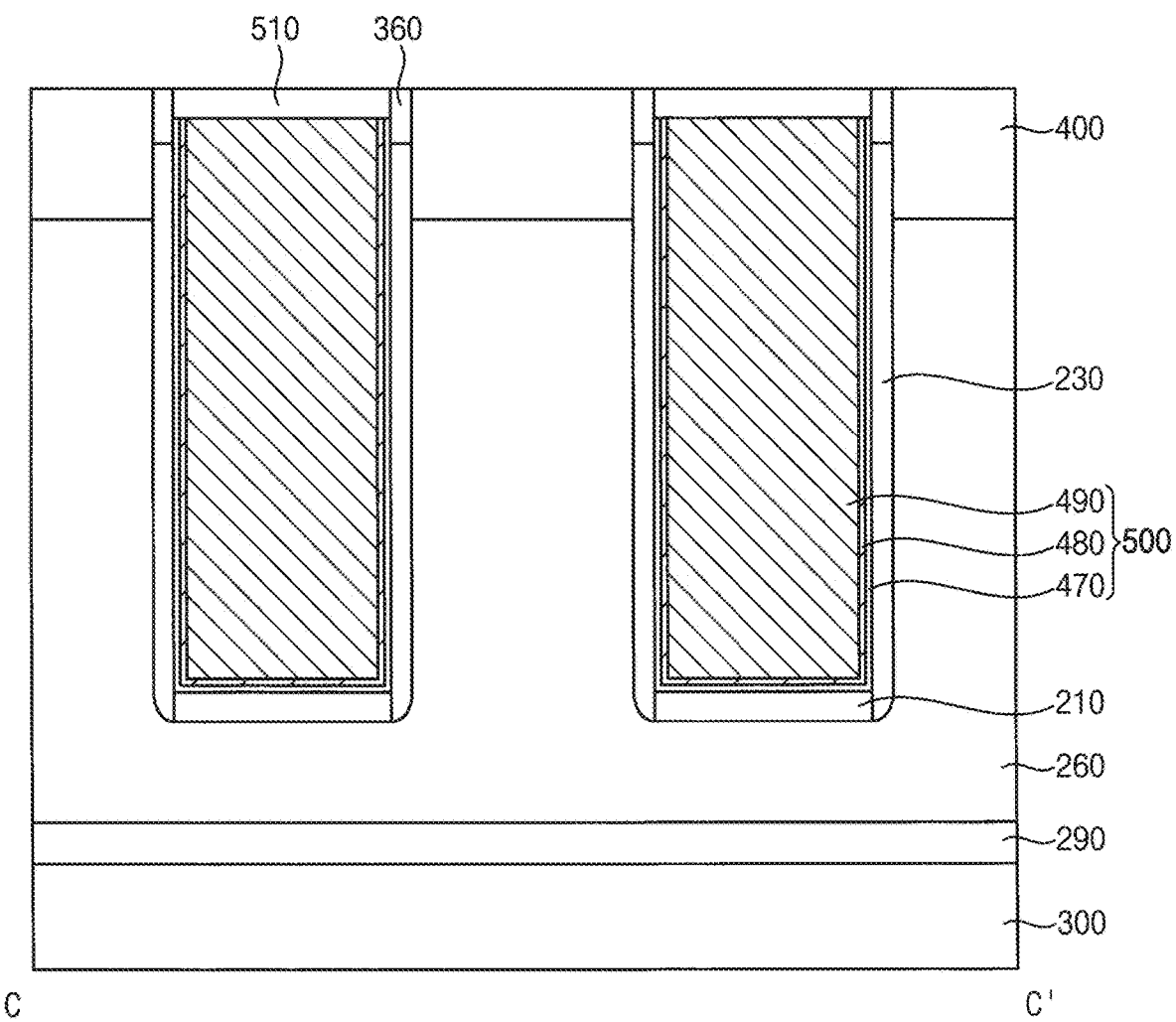

Referring to FIGS. 15 to 17, first and second gate structures 502 and 504 may be formed to fill the third and first openings 430 and 420, respectively, and a third gate structure 500 may be also formed to fill the second opening 420 adjacent the first and third openings 410 and 430 in the second direction.

Particularly, a heat treatment process may be performed on the surfaces of the first to third semiconductor patterns 174, 144 and 114 exposed by the third and first openings 430 and 410 to form first to third interface patterns 462, 464 and 460, a first gate insulation layer and a workfunction control layer may be conformally formed on surfaces of the first to third interface patterns 462, 464 and 460, the inner sidewalls of the first and second gate spacers 230 and 360 and the first inner spacers 380, lower and upper surfaces of the division pattern 152, and an upper surface of the first dummy gate mask 210, and a first gate electrode layer may be formed to fill the first to third openings 410, 420 and 430.

The first gate insulation layer, the first workfunction control layer and the first gate electrode layer may be formed by, e.g., a chemical vapor deposition (CVD) process, an atomic layer deposition (ALD) process, a physical vapor deposition (PVD) process, etc. The first to third interface patterns 462, 464 and 460 may be also formed by the CVP process or the ALD process instead of the heat treatment process, and in this case, the first to third interface patterns 462, 464 and 460 may be also formed on the inner sidewalls of the first and second gate spacers 230 and 360 and the first inner spacers 380, the lower and upper surfaces of the division pattern 152, and the upper surface of the first dummy gate mask 210.

The first gate electrode layer, the first workfunction control layer, and the first gate insulation layer may be planarized until the upper surface of the third insulating interlayer 400. Thus, the first gate structure 502 including the first interface pattern 462, a first gate insulation pattern 472, a first workfunction control pattern 482 and a first gate electrode 492 may be formed in the third opening 430, the second gate structure 504 including the second interface pattern 464, a second gate insulation pattern 474, a second workfunction control pattern 484 and a second gate electrode 494 may be formed in the first opening 410, and the third gate structure 500 including the third interface pattern 460, a third gate insulation pattern 470, a third workfunction control pattern 480 and a third gate electrode 490 may be formed in the second opening 420.

Each of the first to third interface patterns 462, 464 and 460 may include an oxide, e.g., silicon oxide, each of the first to third gate insulation patterns 472, 474 and 470 may include a metal oxide having a high dielectric constant, e.g., hafnium oxide, tantalum oxide, zirconium oxide.

Each of the first to third workfunction control patterns 482, 484 and 480 may include, e.g., titanium nitride, titanium oxynitride, tantalum nitride, tantalum oxynitride, tungsten nitride, tungsten carbonitride, aluminum oxide, etc., and each of the first to third gate electrodes 492, 494 and 490 may include a metal, e.g., titanium, aluminum, etc., an alloy, or a nitride or carbide of the metal.

Upper portions of the second and third gate structures 504 and 500 may be removed to form a third recess, and a capping pattern 510 may be formed in the third recess. The capping pattern 510 may include a nitride, e.g., silicon nitride.

Figure 18:
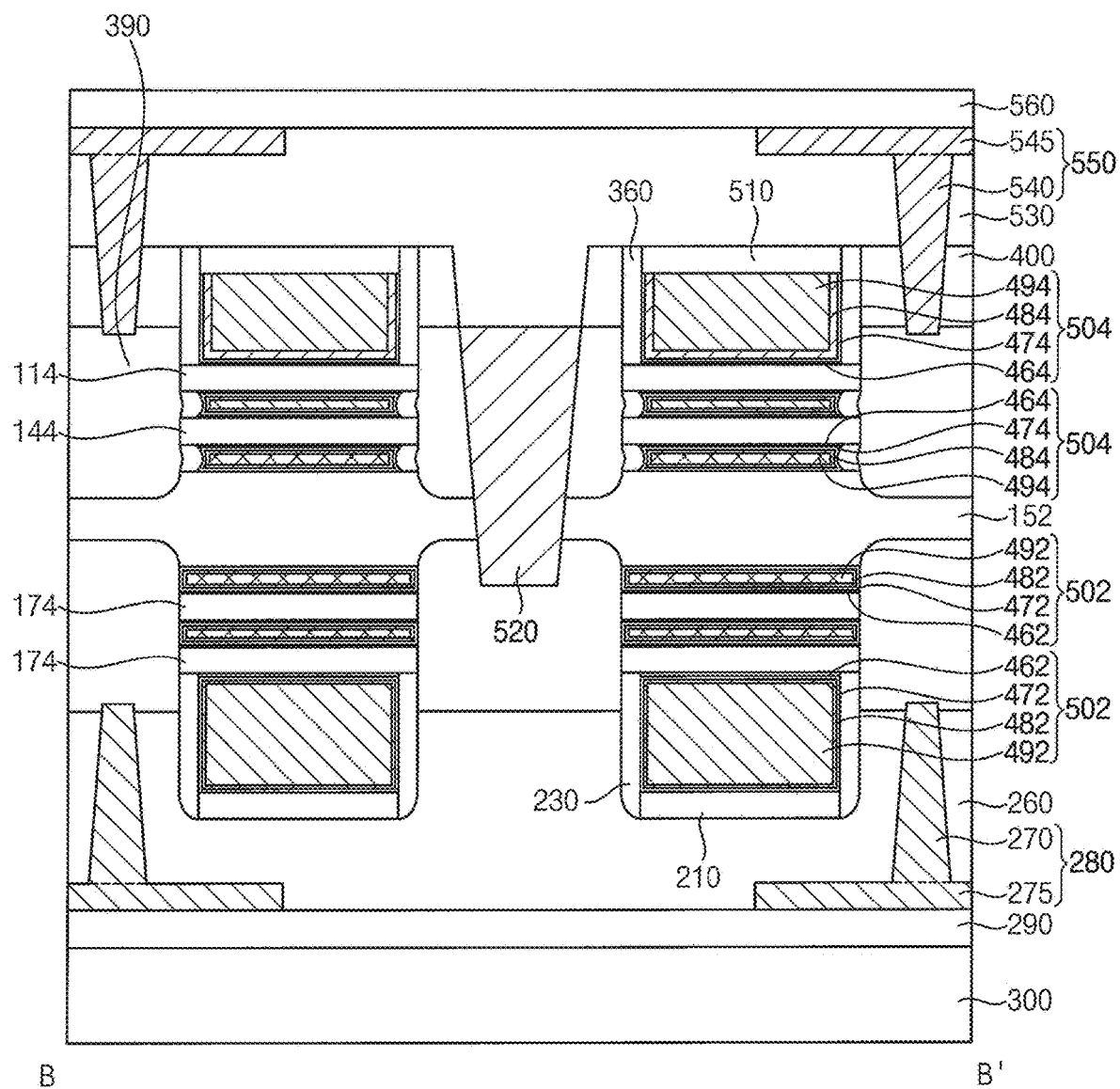
Figure 19:
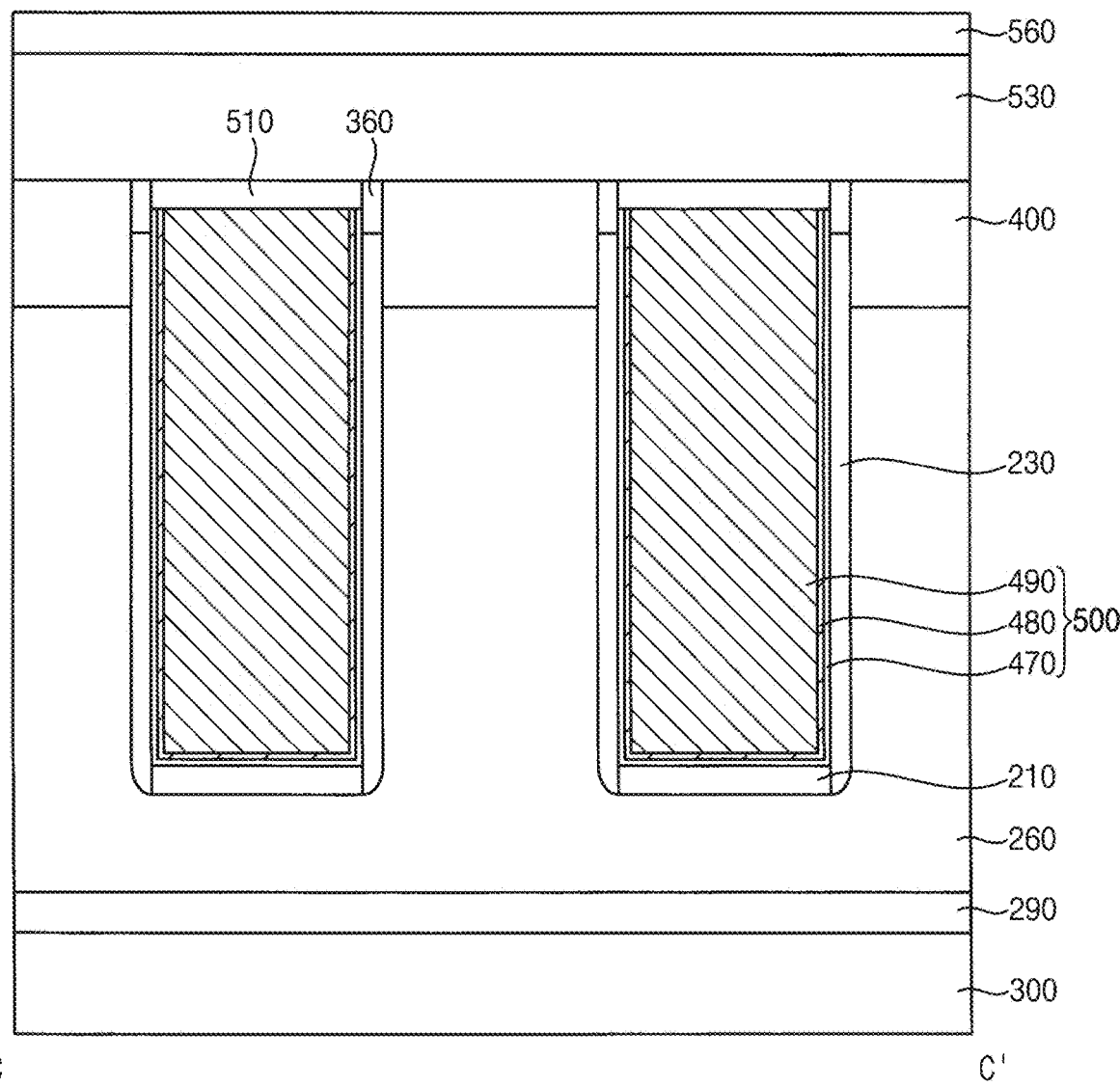
Figure 19:
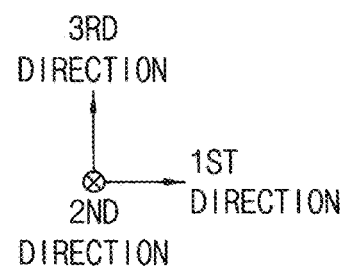

Referring to FIGS. 18 and 19, a connection plug 520 may be formed through the third insulating interlayer 400, the second source/drain layer 390, the division pattern 152 and an upper portion of the first source/drain layer 250, and an upper portion of the connection plug 520 may be removed by, e.g., an etch back process.

In example embodiments, the connection plug 520 may be formed to extend through an upper portion of one of the first source/drain layers 250 not contacting the first wiring structure 280, and thus may extend through some of the second source/drain layers 390. In the drawings, one connection plug 520 extending through one of the second source/drain layers 390 between the second gate structures 504 is shown. The connection plug 520 may include a metal, a metal nitride, a metal silicide, or doped polysilicon.

A fourth insulating interlayer 530 may be formed on the third insulating interlayer 400, the connection plug 520, the capping pattern 510 and the second gate spacer 360, and a second wiring structure 550 may be formed through the fourth insulating interlayer 530 to contact the second source/drain layer 390. The second wiring structure 550 may be formed by, e.g., a damascene process, and may include a second via 540 contacting the second source/drain layer 390 and a second wiring 545 on the second via 540. The second via 540 and the second wiring 545 may include a metal, a metal nitride, a metal silicide, or doped polysilicon. In example embodiments, the second wiring structure 550 may contact an upper surface of one of the second source/drain layers 390 through which no connection plug 520 extends. In the drawings, two second wiring structures 550 contacting two source/drain layers 390, respectively, are shown.

A fifth insulating interlayer 560 may be formed on the second wiring structure 550 and the fourth insulating interlayer 530 to complete the fabrication of the semiconductor device. Each of the fourth and fifth insulating interlayers 530 and 560 may include an oxide, e.g., silicon oxide to be merged with each other.

The semiconductor device may include a first transistor having the first gate structure 502 and the first source/drain layers 250 at opposite sides thereof in the first direction and a second transistor having the second gate structure 504 and the second source/drain layers 390 at opposite sides thereof in the first direction.

As illustrated above, the second dummy gate structure 350 may be formed to be aligned with the exposed portion of the first dummy gate structure 220 in the third direction, the first and second transistors, which may be formed from the first and second dummy gate structures 220 and 350, respectively, may be easily formed to be aligned with each other. The first and second dummy gate structures 220 and 350 may be removed to form the first and third openings 410 and 430 and the first and second gate structures 502 and 504 may be simultaneously formed to fill the first and third openings 410 and 430, and thus the deterioration of characteristics of a first one of the first and second gate structures 502 and 504 may be limited and/or prevented when compared to the case in which a second one of the first and second gate structures 502 and 504 is formed after the formation of the first one.

In example embodiments, the first and second transistors may be formed under and over, respectively, the division pattern 152, and may be in symmetry with respect to the division pattern 152 in the third direction. The first and second source/drain layers 250 and 390 may be divided by the division pattern 152, and thus may not contact each other. However, the first and second source/drain layers 250 and 390 may be electrically connected with each other by the connection plug 520 extending at least partially through some of the first and second source/drain layers 250 and 390.

In example embodiments, the first and second transistors may be PMOS and NMOS transistors, respectively, and thus the first source/drain layer 250 may include, e.g., silicon-germanium doped with p-type impurities and the second source/drain layer 390 may include, e.g., silicon layer doped with n-type impurities or silicon carbide layer doped with n-type impurities.

In example embodiments, each of the first semiconductor patterns 174 may extend through the first gate structure 502 in the first direction, and may contact a sidewall of the first source/drain layer 250. Each of the first semiconductor patterns 174 may serve as a channel of the first transistor, and thus the first transistor may be a multi-bridge channel field effect transistor (MBCFET).

Each of the second and third semiconductor patterns 144 and 114 may extend through the second gate structure 504 in the first direction. Each of the second and third semiconductor patterns 144 and 114 may serve as a channel of the second transistor, and thus the second transistor may be an MBCFET.

Figure 20:
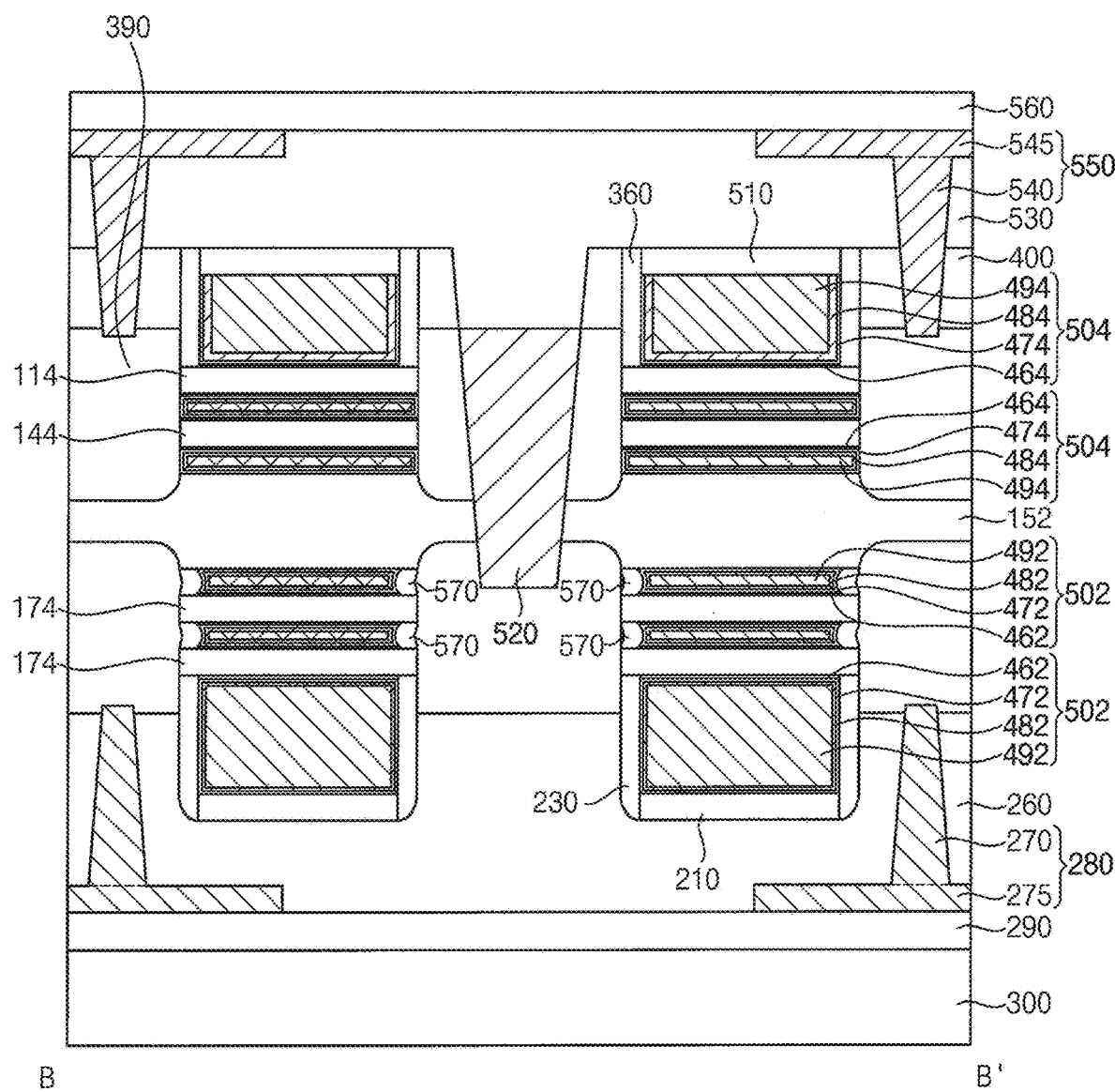

However, the first inner spacer 380 including an insulating material may be formed between each of the second and third semiconductor patterns 144 and 114 and the second source/drain layer 390. However, inventive concepts may not be limited thereto. Referring to FIG. 20, the first transistor, which may be the PMOS transistor, may also include a second inner spacer 570 between each of the first semiconductor patterns 174 and the first source/drain layer 250. As illustrated in the drawings, the second transistor may not include the first inner spacer 380. That is, each of the first and second transistors regardless of the conductivity type thereof may include or may not include the inner spacer.

In the drawings, the first and second transistors, which are the PMOS and NMOS transistors, respectively, are formed at lower and upper levels, respectively, however, inventive concepts may not be limited thereto, and the first and second transistors may be formed at upper and lower levels, respectively.

In the drawings, the first and second transistors are the PMOS and NMOS transistors, respectively, however, inventive concepts may not be limited thereto. Thus, both of the first and second transistors may be PMOS transistors or NMOS transistors.

As illustrated above, the first and second gate structures 502 and 504 may be formed by the same processes. Thus, corresponding components of the first and second gate structures 502 and 504 may include the same material and have the same thickness. That is, the first and second interface patterns 462 and 464, the first and second gate insulation patterns 472 and 474, the first and second workfunction control patterns 482 and 484, and the first and second gate electrodes 492 and 494 may each include the same material and have the same thickness.

However, in example embodiments, the first workfunction control pattern 482 may cover a sidewall and lower and upper surfaces of the first gate electrode 492, while the second workfunction control pattern 484 may cover a sidewall and a lower surface of the second gate electrode 484.

In example embodiments, the third gate structure 500 may be formed at each of opposite sidewalls in the second direction of the first and second gate structures 502 and 504 to extend in the third direction to contact both of the first and second gate structures 502 and 504. As illustrated above, the third gate structure 500 may be integrally formed with the first and second gate structures 502 and 504 by the same processes as the first and second gate structures 502 and 504. A portion of a gate structure that may be formed by the processes overlapping the line structure, that is, the division pattern 152 in the third direction may be referred to as the first and second gate structures 502 and 504, and a portion of the gate structure that may be formed by the processes not overlapping the division pattern 152 in the third direction may be referred to as the third gate structure 500. Thus, a lower surface of the third gate structure 500 may be substantially coplanar with that of the first gate structure 502, and an upper surface of the third gate structure 500 may be substantially coplanar with that of the second gate structure 504.

The first to third gate structures 502, 504 and 500 may be integrally formed, and thus may be referred to as the gate structure, which may extend in the second direction on the second substrate 300. That is, the first and second transistors may share the gate structure. The division pattern 152 may extend in the first direction through the gate structure, and a plurality of division patterns 152 may be formed to be spaced apart from each other in the second direction.

The first source/drain layers 250 may be formed under the division pattern 152 at opposite sides, respectively, in the first direction of the gate structure, and the second source/drain layers 390 may be formed over the division pattern 152 at opposite sides, respectively, in the first direction. A lower portion of the gate structure and the first source/drain layers 250 may form the first transistor, and an upper portion of the gate structure and the second source/drain layers 390 may form the second transistor.

The first wiring structure 280 in the first and second insulating interlayers 260 and 290 between the second substrate 300 and the first transistor may contact one of the first source/drain layers 250 not contacting the connection plug 520, and the second wiring structure 550 in the third to fifth insulating interlayers 400, 530 and 560 on the second transistor may contact one of the second source/drain layers 390 not contacting the connection plug 520.

In example embodiments, the first and second transistors, the connection plug 520 and the first and second wiring structures 280 and 550 may serve as an inverter. That is, each of the first and second source/drain layers 250 and 390 electrically connected with each other by the connection plug 520 may serve as a drain, each of the first and second source/drain layers 250 and 390 contacting the first and second wiring structures 280 and 550 may serve as a source, and each of the first and second gate structures 502 and 504 may be formed between the source and the drain.

Figure 21:
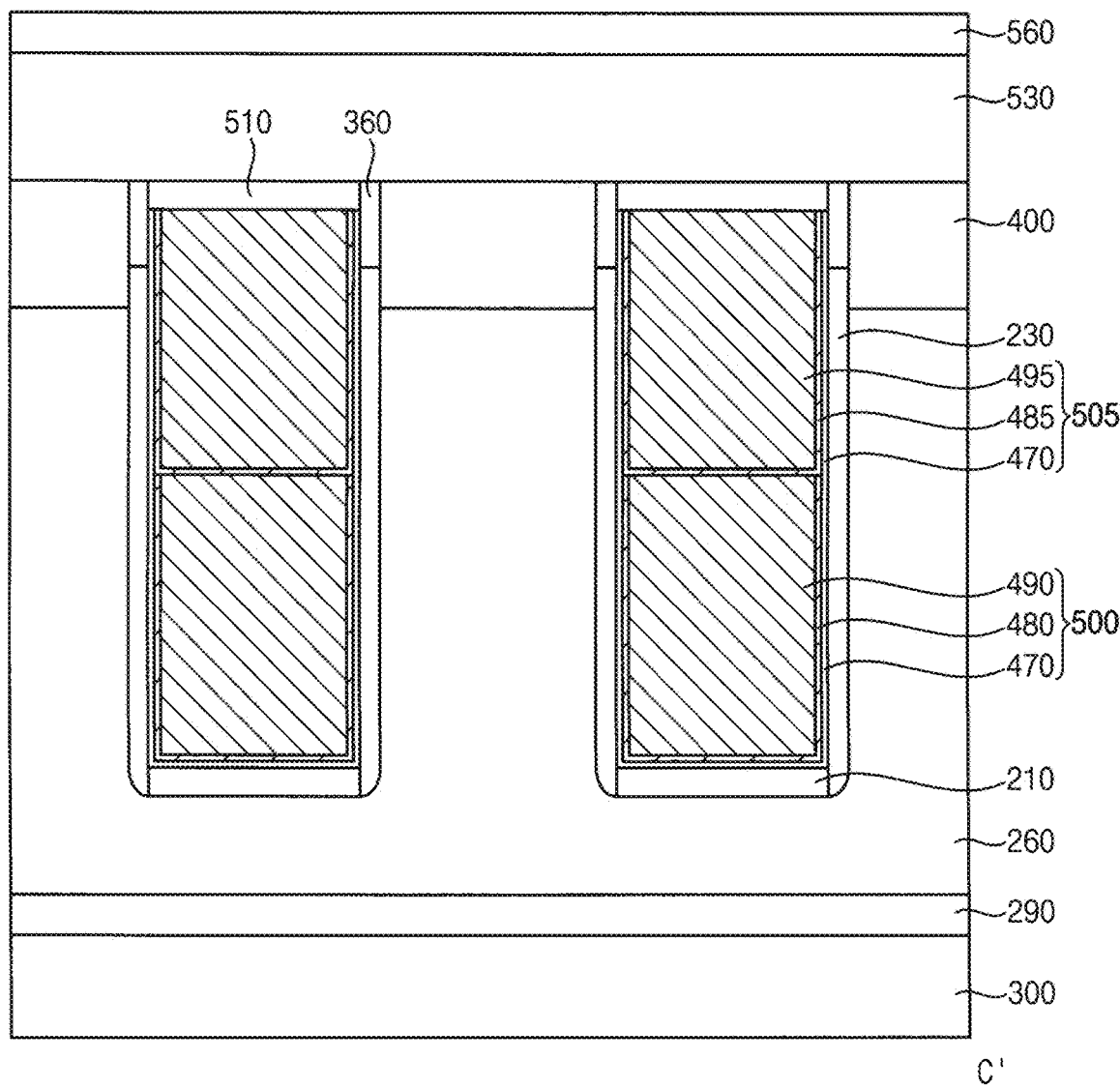
FIG. 21 is a cross-sectional view illustrating a semiconductor device in accordance with example embodiments.

FIG. 21 is a cross-sectional view illustrating a semiconductor device in accordance with example embodiments. This semiconductor device may be substantially the same as that of FIGS. 18 and 19, except for some elements. Thus, like reference numerals refer to like elements, and detailed descriptions thereon are omitted herein.

Referring to FIG. 21, a fourth gate structure 505 may be further formed in the second opening 420 in addition to the third gate structure 500, and the third and fourth gate structures 500 and 505 may be sequentially stacked in the second opening 420 to contact each other.

The fourth gate structure 505 may include the third interface pattern 460 (refer to FIG. 15) and the third gate insulation pattern 470 as the third gate structure 500, and may include a fourth workfunction control pattern 485 and a fourth gate electrode 495 unlike the third gate structure 500. The fourth workfunction control pattern 485 may cover a sidewall and a lower surface of the fourth gate electrode 495.

In example embodiments, the fourth gate structure 505 may be formed by forming the third gate structure 500 in the second opening 420, removing upper portions of the third workfunction control pattern 480 and the third gate electrode 490 of the third gate structure 500 through, e.g., an etch back process, and forming the fourth workfunction control pattern 485 and the fourth gate electrode 495 in an upper portion of the second opening 420.

In example embodiments, the third gate structure 500 may be formed integrally with the first gate structure 502 so that corresponding components of the first and third gate structures 502 and 500 may include the same material, and the fourth gate structure 505 may be formed integrally with the second gate structure 504 so that corresponding components of the second and fourth gate structures 504 and 505 may include the same material.

Thus, for example, when the first transistor is a PMOS transistor, the first and third workfunction control patterns 482 and 480 and the first and third gate electrodes 492 and 490 may have materials and/or thicknesses, which may be proper for the workfunction and/or threshold voltage of the PMOS transistor, and when the second transistor is an NMOS transistor, the second and fourth workfunction control patterns 484 and 485 and the second and fourth gate electrodes 494 and 495 may have materials and/or thicknesses, which may be proper for the workfunction and/or threshold voltage of the NMOS transistor.

In an example embodiment, the second and fourth gate electrodes 494 and 495 may include a material different from that of the first and second third gate electrodes 492 and 490. For example, the second and fourth gate electrodes 494 and 495 may include titanium nitride, and the first and third gate electrodes 492 and 490 may include titanium aluminum, titanium aluminum carbide, titanium aluminum nitride, etc.

Figure 22:
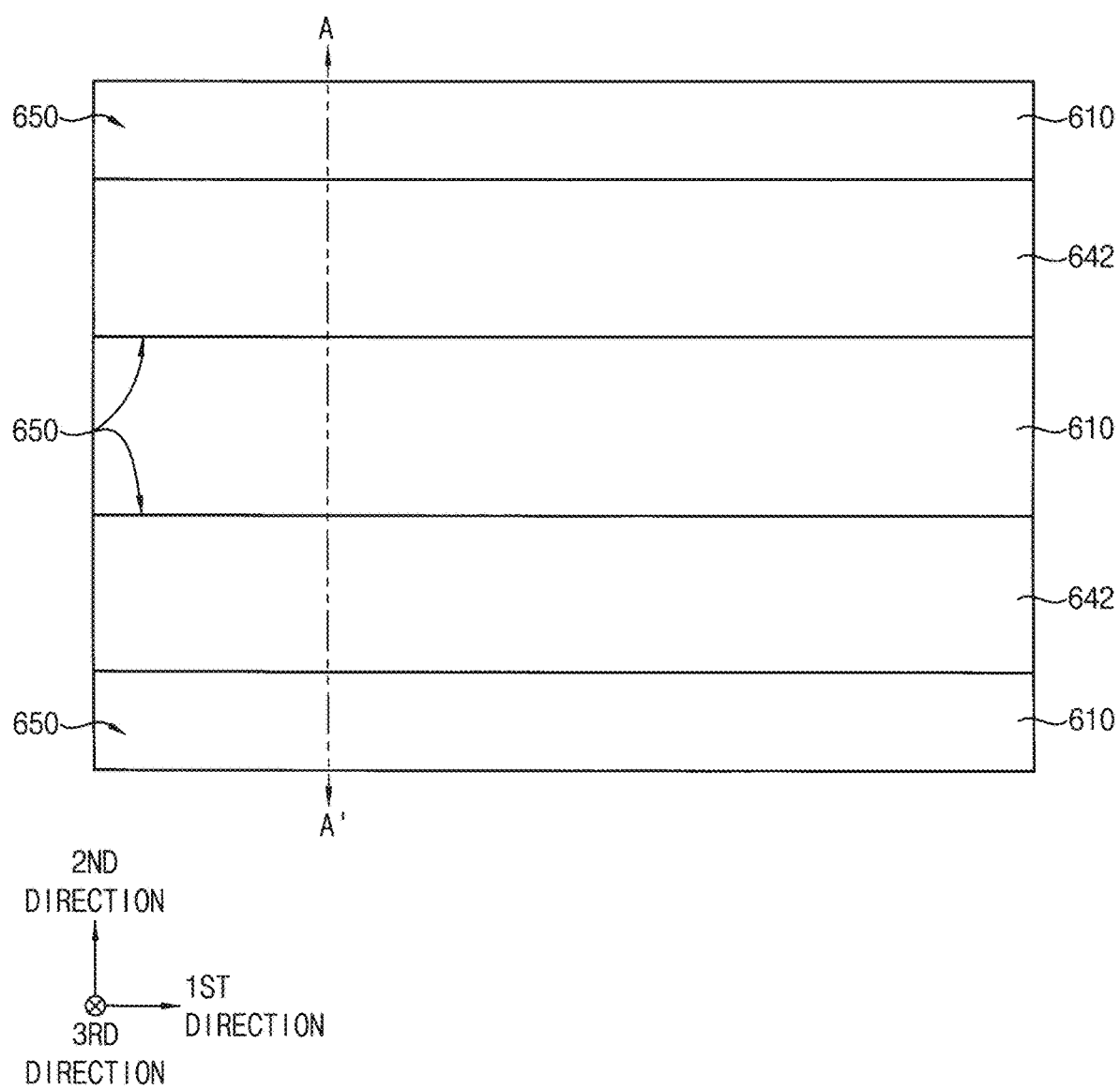
FIGS. 22 to 32 are plan views and cross-sectional views illustrating a method of manufacturing a semiconductor device in accordance with example embodiments.
Figure 23:
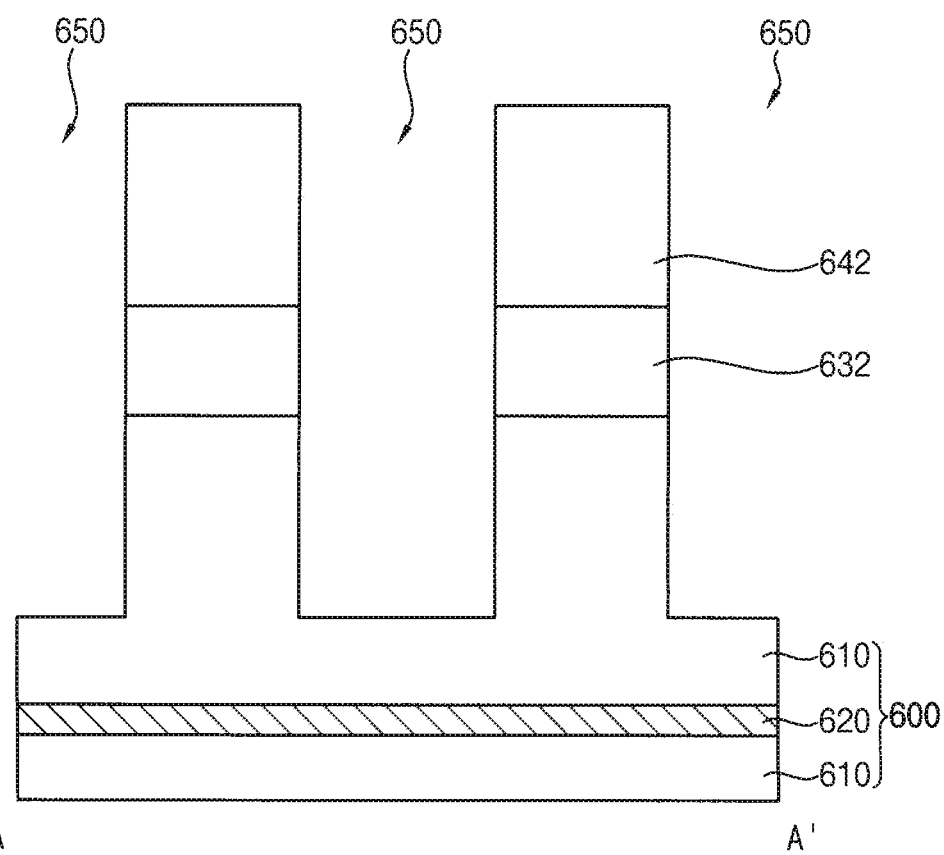
Figure 23:
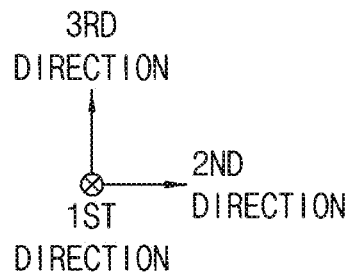
Figure 24:
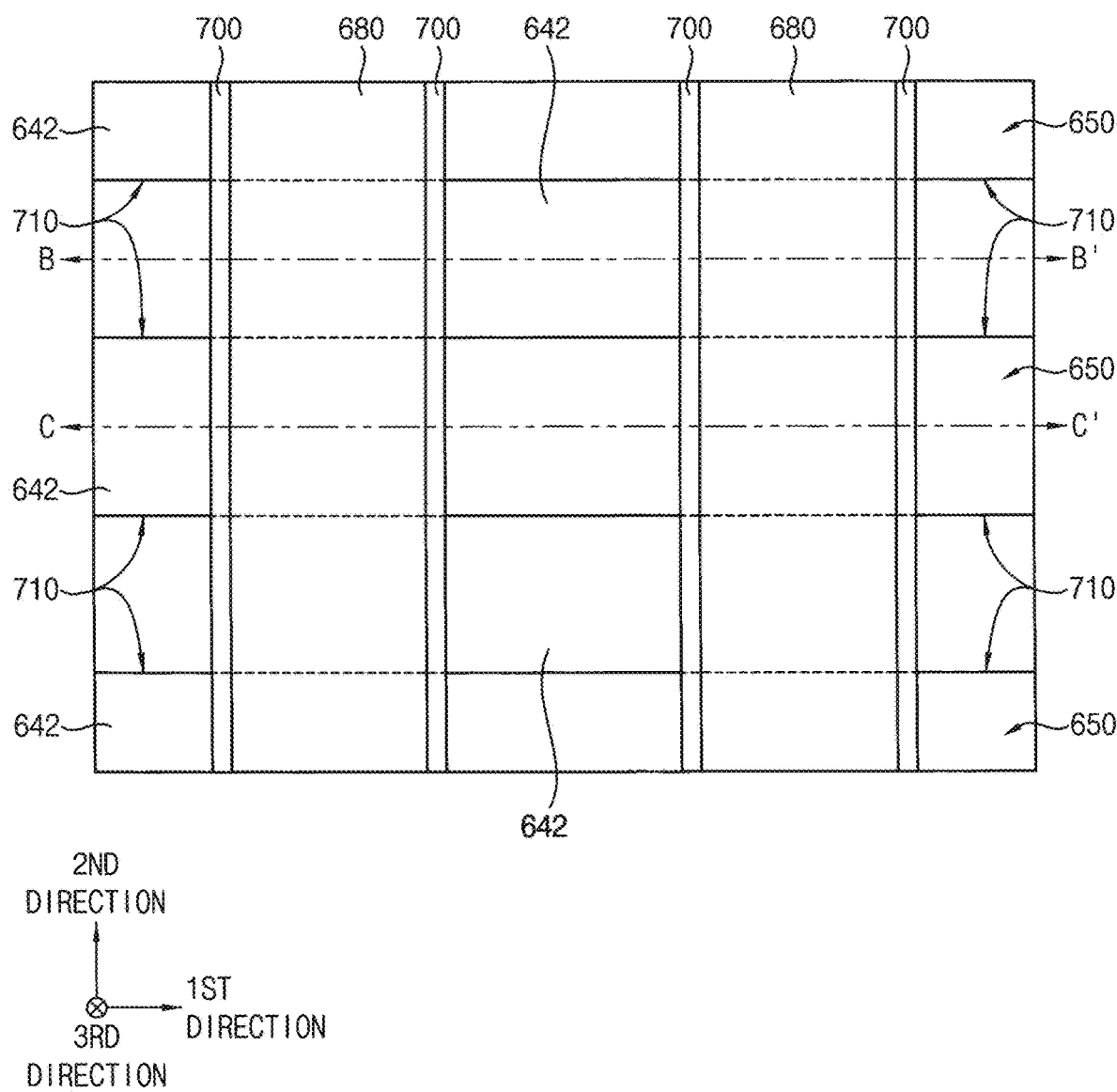

FIGS. 22 to 32 are plan views and cross-sectional views illustrating a method of manufacturing a semiconductor device in accordance with example embodiments. Particularly, FIGS. 22 and 24 are the plan views and FIGS. 23 and 25 to 32 are the cross-sectional views.

FIG. 23 is a cross-sectional views taken along a line A-A' of a corresponding plan view, FIGS. 25, 27, 29 and 31 are cross-sectional views taken along lines B-B' of corresponding plan views, respectively, and FIGS. 26, 28, 30 and 32 are cross-sectional views taken along lines C-C' of corresponding plan views, respectively. This method may include processes substantially the same as or similar to those illustrated with reference to FIGS. 1 to 19, and thus repetitive explanations thereon are omitted herein.

Referring to FIGS. 22 and 23, a division layer and a semiconductor layer may be sequentially stacked on a first substrate 600.

The first substrate 600 may include a bulk substrate 610, an insulation layer 620, and the bulk substrate 610 sequentially stacked.

The semiconductor layer, the division layer, and an upper portion of the bulk substrate 610 may be patterned by an etching process using an etching mask to form a trench 650 extending in the first direction on the first substrate 600.

Thus, a protrusion extending in the first direction may be formed on the first substrate 600, and a plurality of protrusions may be formed to be spaced apart from each other in the second direction. A line structure including a division pattern 632 and a first semiconductor line 642 sequentially stacked may be formed on each of the protrusions on the first substrate 600.

Figure 25:
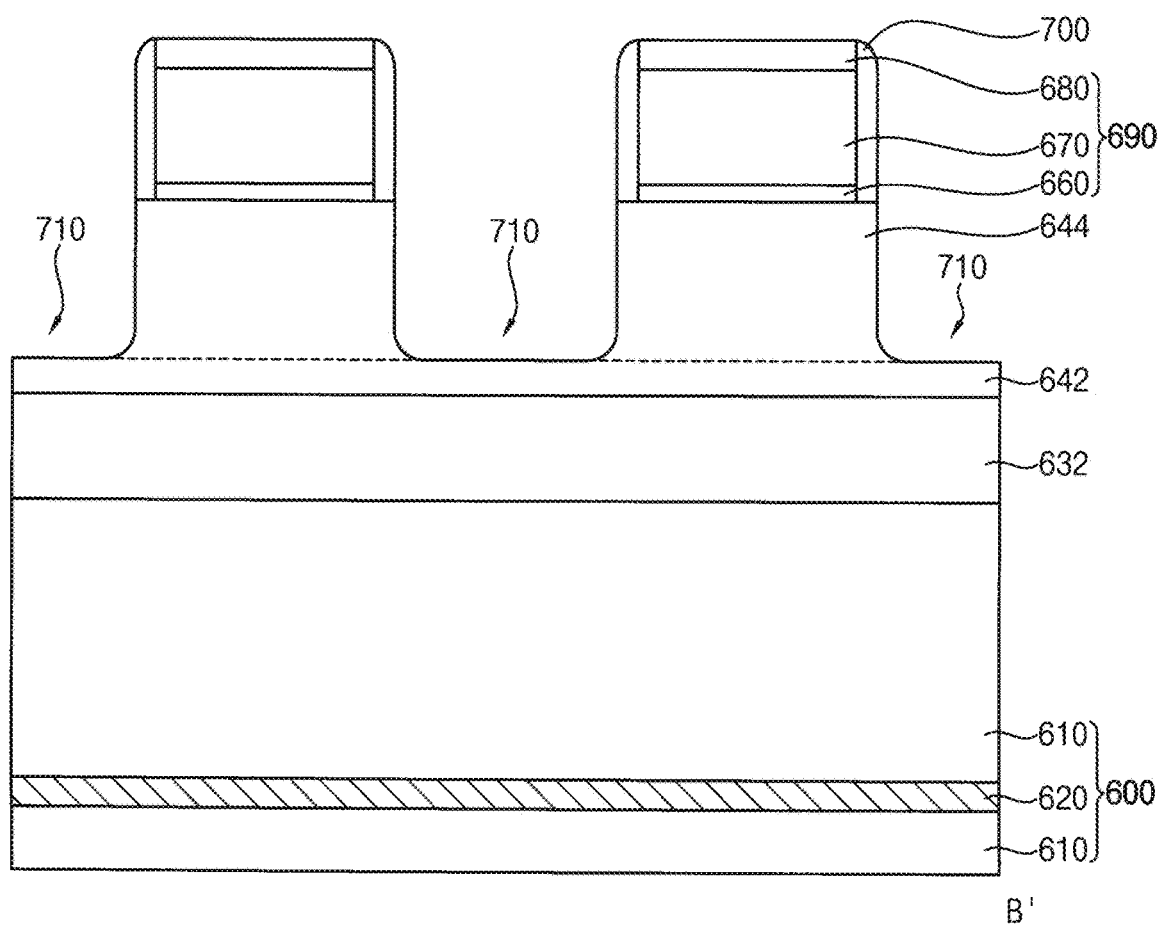
Figure 26:
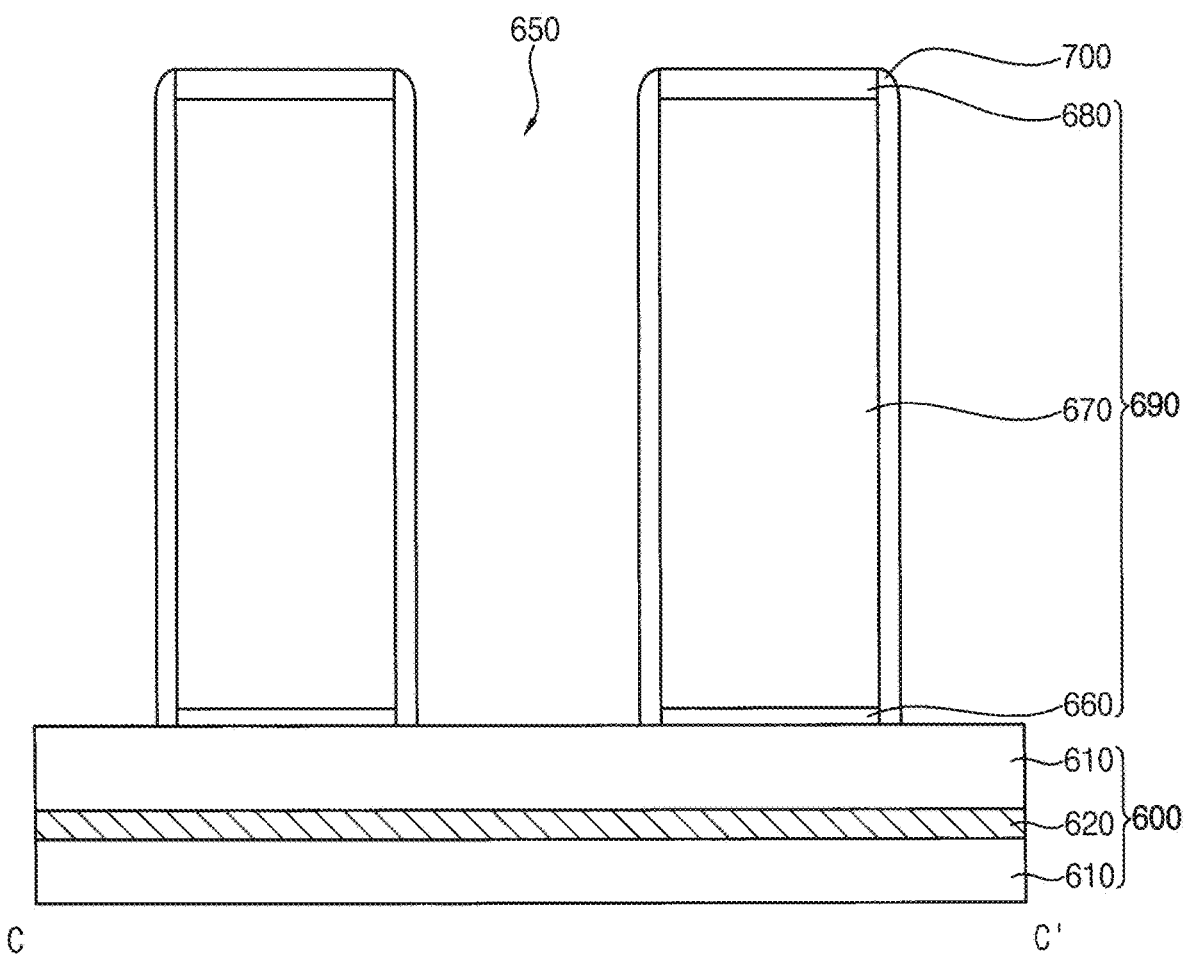

Referring to FIGS. 24 to 26, a first dummy gate structure 690 may be formed on the first substrate 600 to partially cover the line structure.

The first dummy gate structure 690 may include a first dummy gate insulation pattern 660, a first dummy gate electrode 670, and a first dummy gate mask 680 sequentially stacked on the first substrate 600 and the line structure.

In example embodiments, the first dummy gate structure 690 may extend in the second direction, and a plurality of first dummy gate structures 690 may be formed to be spaced apart from each other in the first direction. The first dummy gate structure 690 may cover an upper surface of a portion and a sidewall in the second direction of the line structure and a sidewall in the second direction of a portion of the protrusion on the first substrate 600.

A first gate spacer 700 may be formed on each of opposite sidewalls in the first direction of the first dummy gate structure 690, and the line structure may be etched using the first dummy gate structure 690 and the first gate spacer 700 as an etching mask to form a first recess 710. The first recess 710 may have a bottom higher than an upper surface of the division pattern 632, and thus the division pattern 632 may not be exposed by the first recess 710.

As the first recess 710 is formed, an upper portion of the first semiconductor line 642 may be transformed into a plurality of first semiconductor patterns 644 spaced apart from each other in the first direction under the first dummy gate structure 690 and the first gate spacer 700.

Hereinafter, an upper portion of the first dummy gate structure 690 higher than the bottom of the first recess 710, a portion of the first gate spacer 700 on each of opposite sidewalls of the first dummy gate structure 690, and the first semiconductor pattern 644 thereunder may be referred to as a first structure. In example embodiments, the first structure may extend in the second direction, and a plurality of first structures may be formed to be spaced apart from each other in the first direction.

Figure 27:
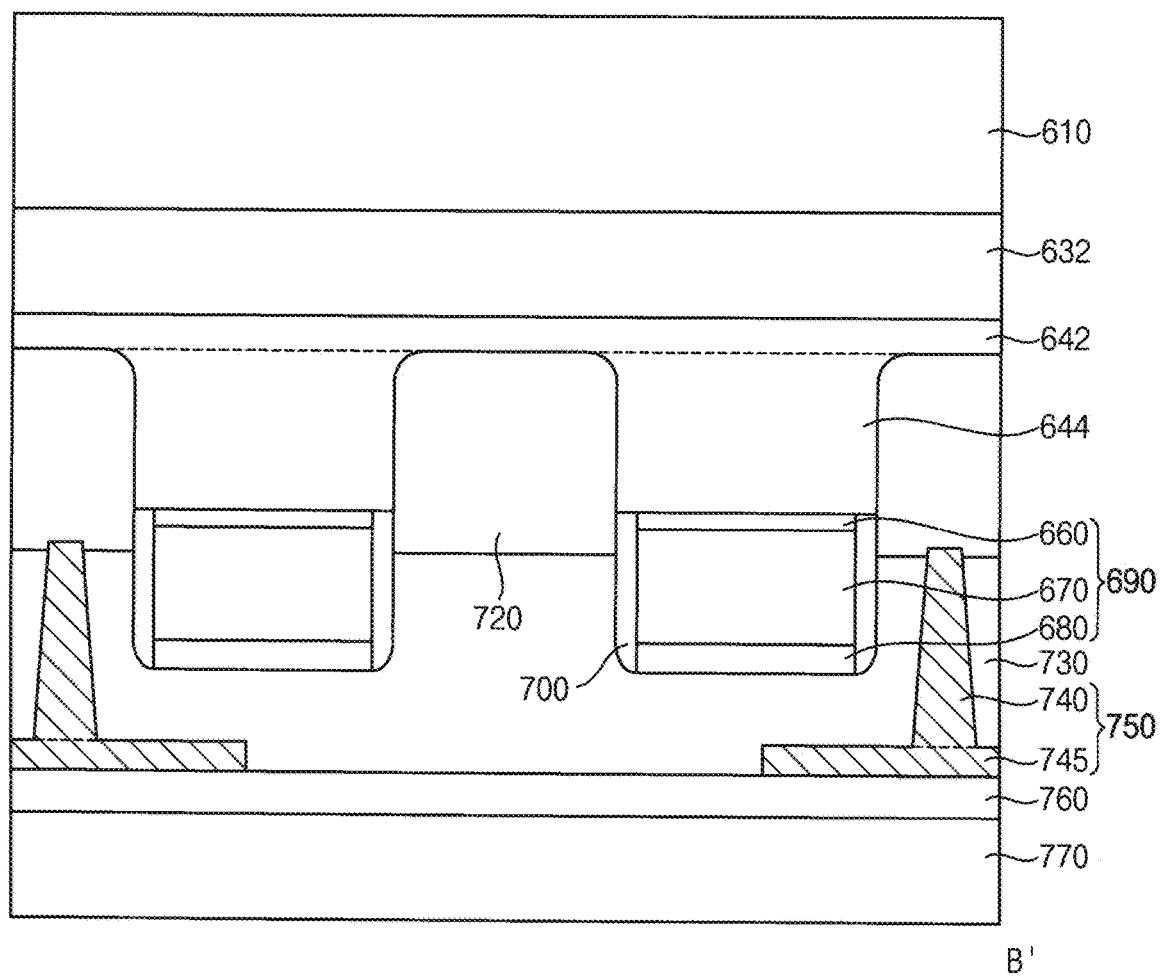
Figure 28:
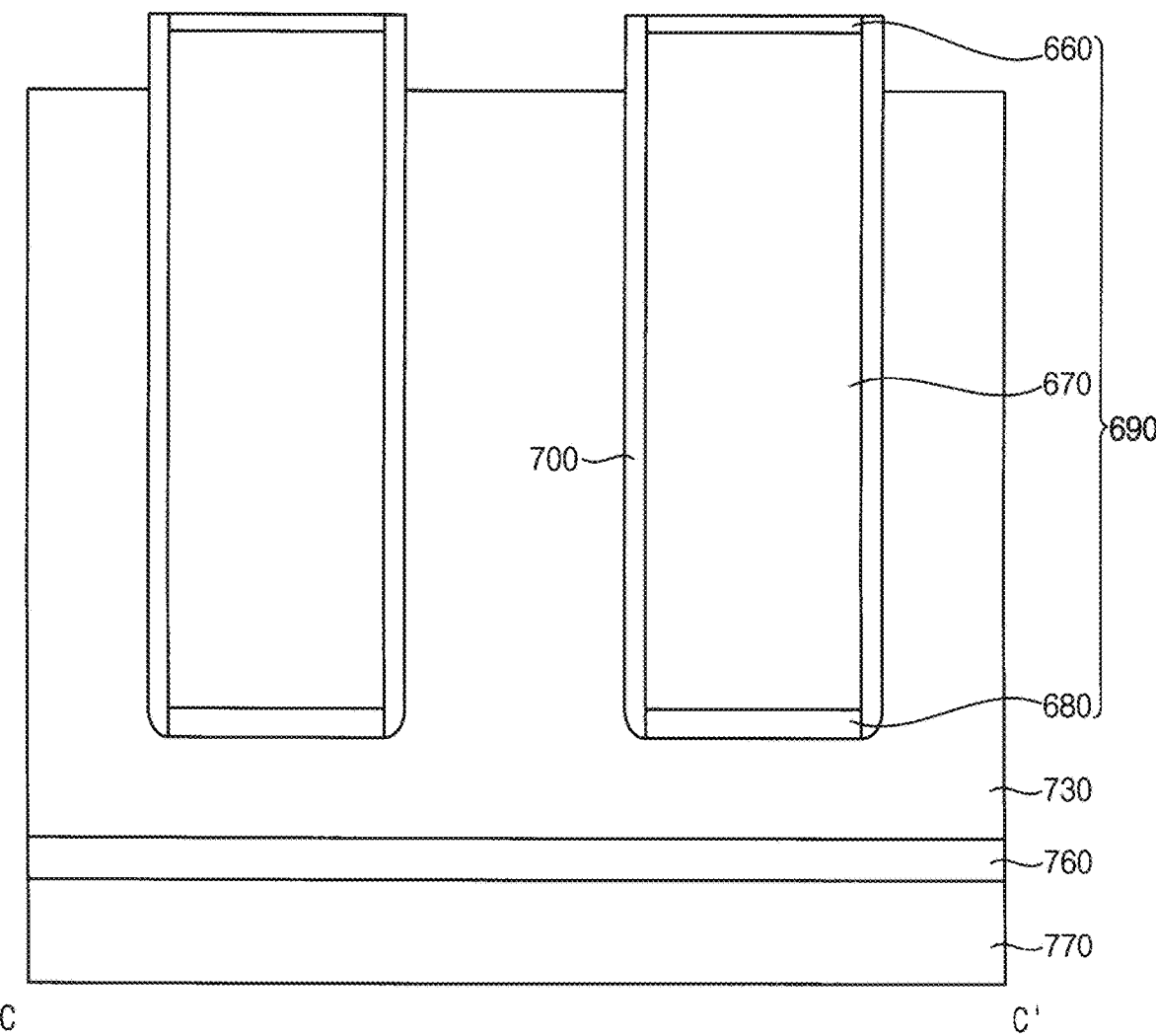

Referring to FIG. 27, processes substantially the same as or similar to those illustrated with reference to FIGS. 7 to 9 may be performed.

Thus, an SEG process may be performed using an upper surface of the first semiconductor line 642 and a sidewall of the first semiconductor pattern 644 exposed by the first recess 710 to form a first source/drain layer 720 in the first recess 710.

A first insulating interlayer 730 may be formed on the first substrate 600 to cover the first structure, the first source/drain layer 720, a lower portion of the first dummy gate structure 690, and a portion of the first gate spacer on a sidewall of the lower portion of the first dummy gate structure 690, a first wiring structure 750 may be formed through the first insulating interlayer 730 to contact the first source/drain layer 720, and a second insulating interlayer 760 may be formed on the first wiring structure 750 and the first insulating interlayer 730. The first wiring structure 750 may include a first via 740 and a first wiring 745.

The first substrate 600 may be turned over so that the second insulating interlayer 760 may face downward, and may be bonded onto a second substrate 770.

The first substrate 600 and a portion of the first insulating interlayer 730 may be removed by, e.g., a grinding process and/or an etching process, and thus a portion of the bulk substrate 610 may remain as a second semiconductor line 612 having a linear shape extending in the first direction under a portion of the first substrate 600 where the line structure is formed.

By the etching process, an upper surface of the first dummy gate insulation pattern 660 and an upper surface and an upper sidewall of the first gate spacer 700 in the first dummy gate structure 690 may be exposed.

Figure 29:
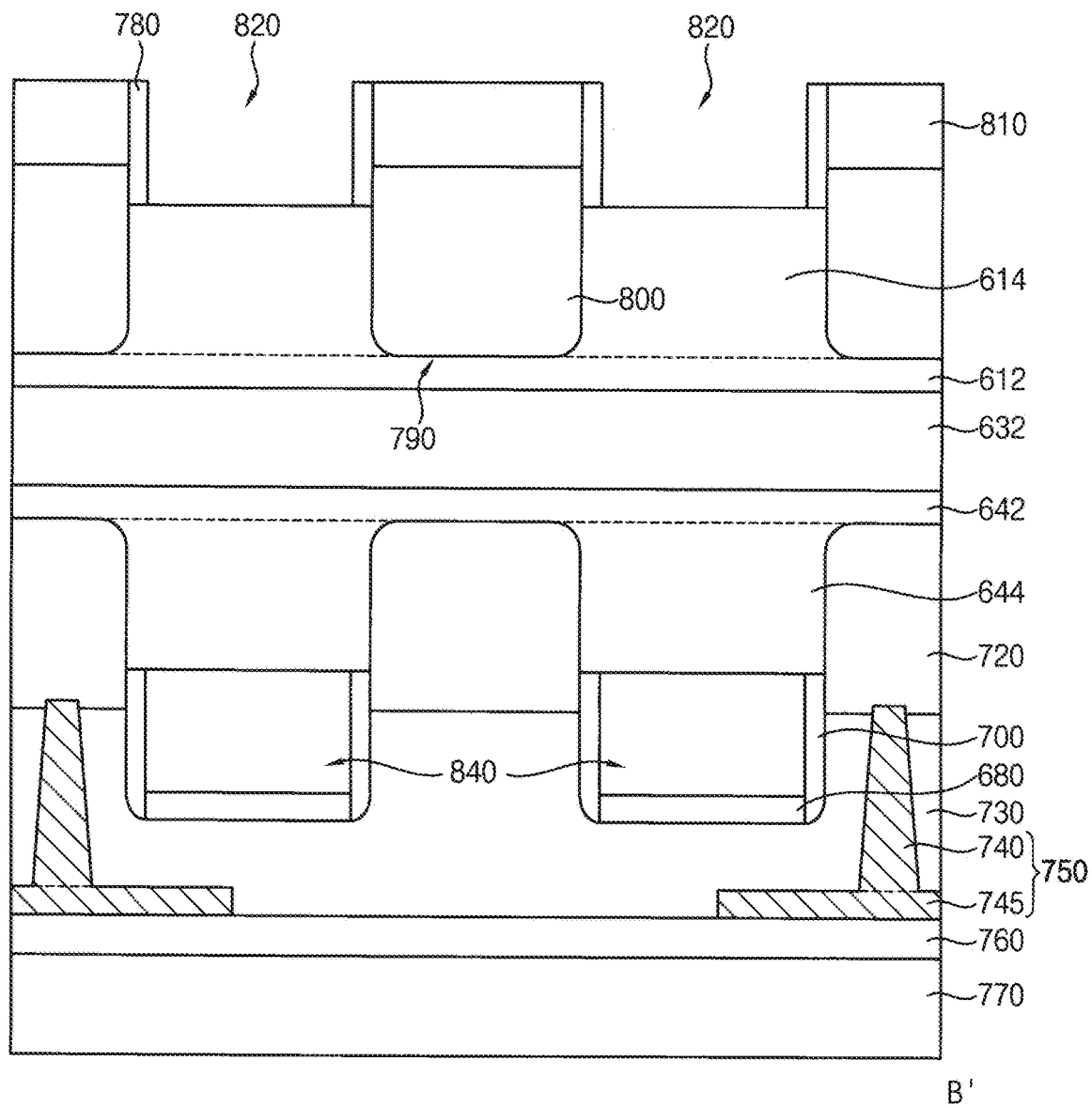
Figure 29:
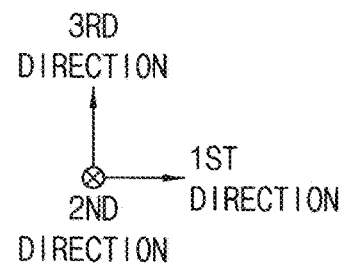
Figure 30:
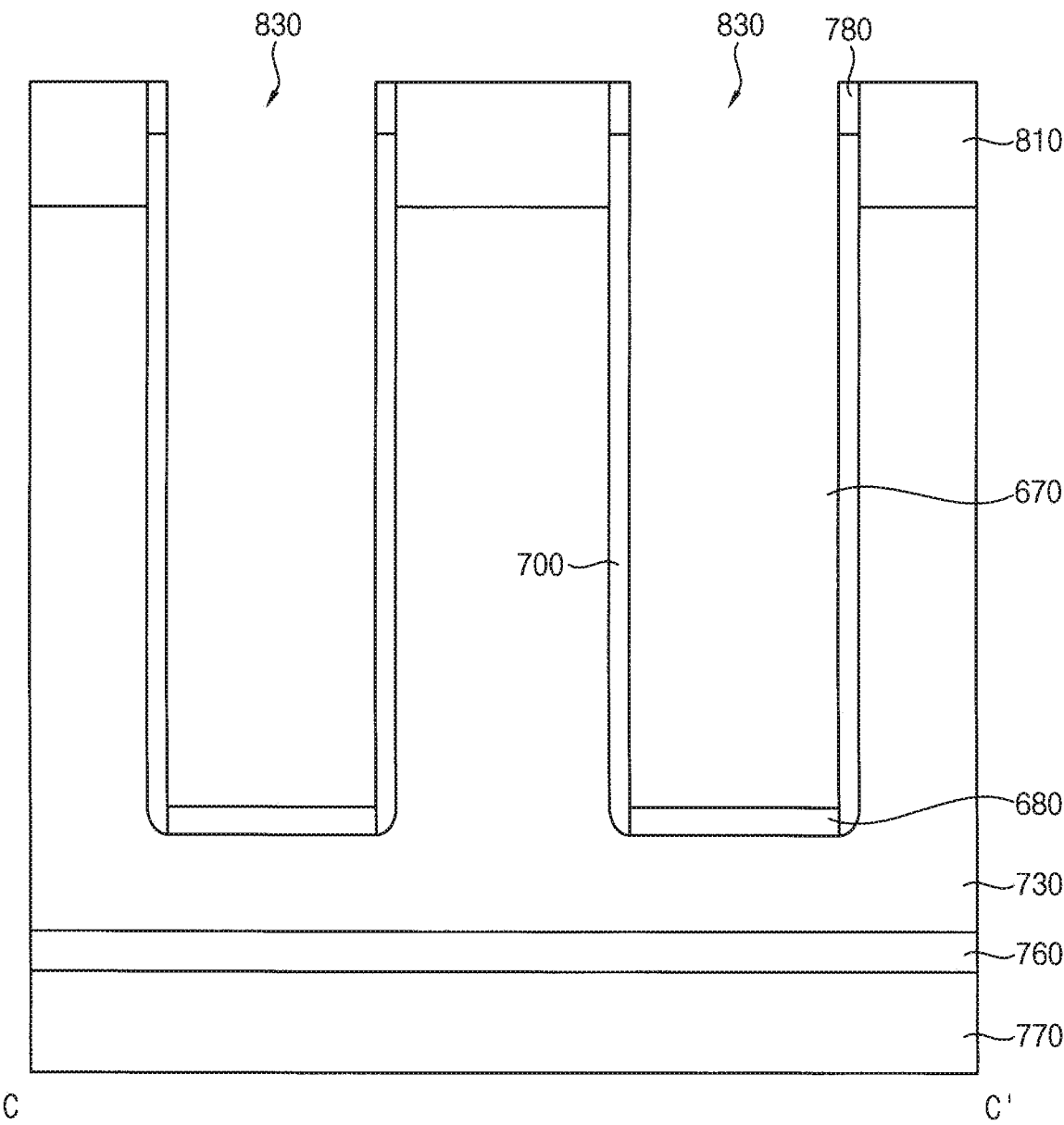

Referring to FIGS. 29 and 30, processes substantially the same as or similar to those illustrated with reference to FIGS. 10 to 14 may be performed.

Thus, a second dummy gate structure (not shown) extending in the second direction and a second gate spacer 780 on each of opposite sidewalls in the first direction of the second dummy gate structure may be formed on the exposed first dummy gate structure 690, the first gate spacer 700 and the second semiconductor line 612. The second dummy gate structure and the second gate spacer 780 may be aligned with the first dummy gate structure 690 and the first gate spacer 700, respectively, in the third direction.

The second semiconductor line 612 may be etched using the second dummy gate structure and the second gate spacer 780 as an etching mask to form a second recess 790 having a bottom higher than an upper surface of the division pattern 632, and an upper portion of the second semiconductor line 612 may be transformed into a plurality of second semiconductor patterns 614.

Hereinafter, the second dummy gate structure, the second gate spacer on each of opposite sidewalls of the second dummy gate structure, and the second semiconductor pattern 614 thereunder may be referred to as a second structure. In example embodiments, the second structure may extend in the second direction, and a plurality of second structures may be formed to be spaced apart from each other in the first direction.

An SEG process may be performed using the upper surface of the second semiconductor line 612 and the sidewall of the second semiconductor pattern 614 exposed by the second recess 790 as a seed to form a second source/drain layer 800.

A third insulating interlayer 810 may be formed on the second structure, the second source/drain layer 800, an upper portion of the first dummy gate structure 690, and a portion of the first gate spacer 700 on a sidewall of the upper portion of the first dummy gate structure 690, the third insulating interlayer 810 may be planarized until the second dummy gate electrode in the second structure may be exposed, and the second dummy gate structure may be removed so that a first opening 820 exposing an inner sidewall of the second gate spacer 780 and a surface of the second semiconductor pattern 614 at a first area where the line structure is formed, a second opening exposing inner sidewalls of the first and second gate spacers 700 and 780 and an upper surface of the first dummy gate mask 680 at a second area adjacent the first area in the second direction, and a third opening 840 exposing an inner sidewall of the first gate spacer 700, an upper surface of the first dummy gate mask 680, and a lower surface of the first semiconductor pattern 644 at the first area.

Figure 31:
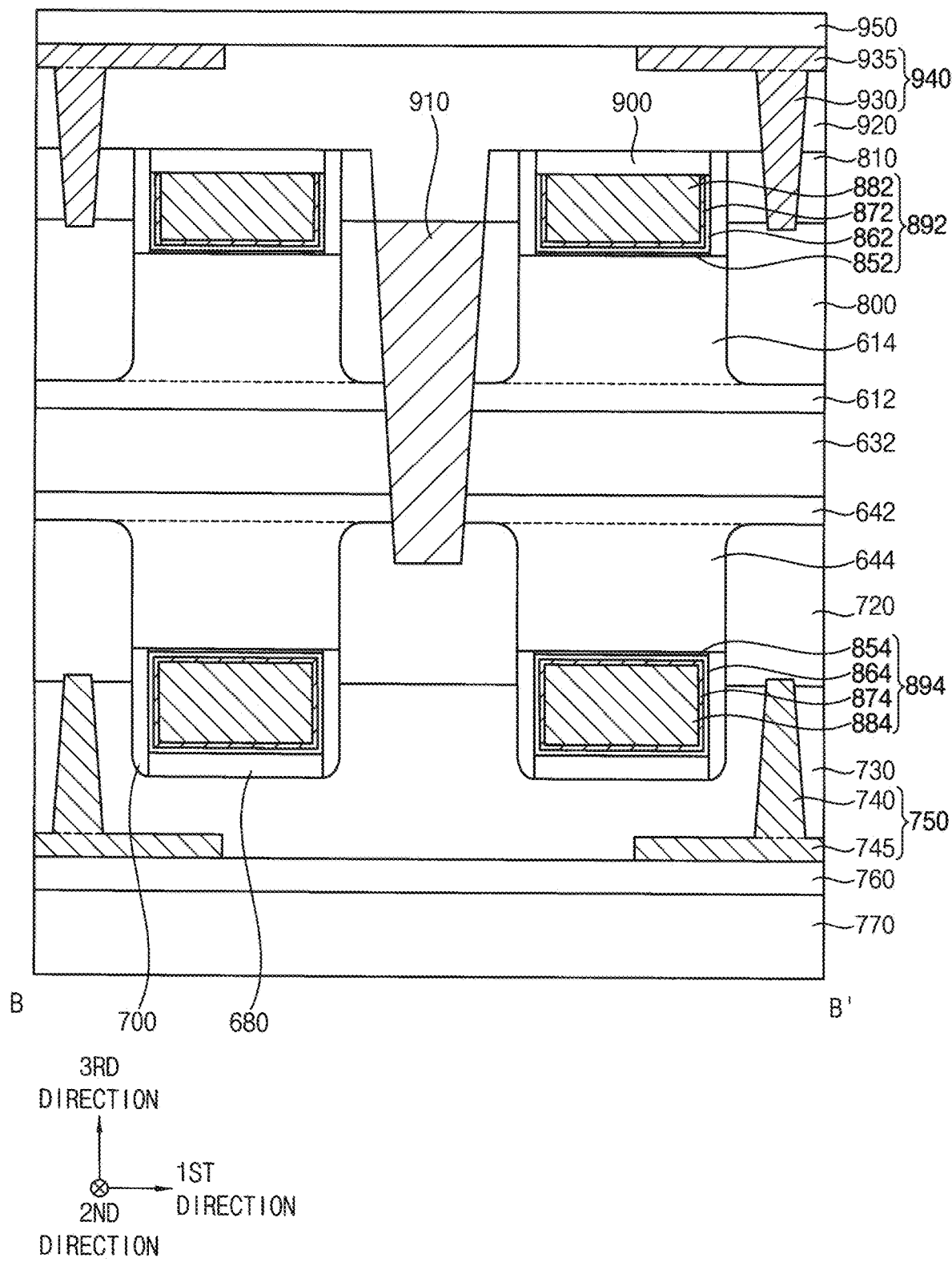
Figure 32:
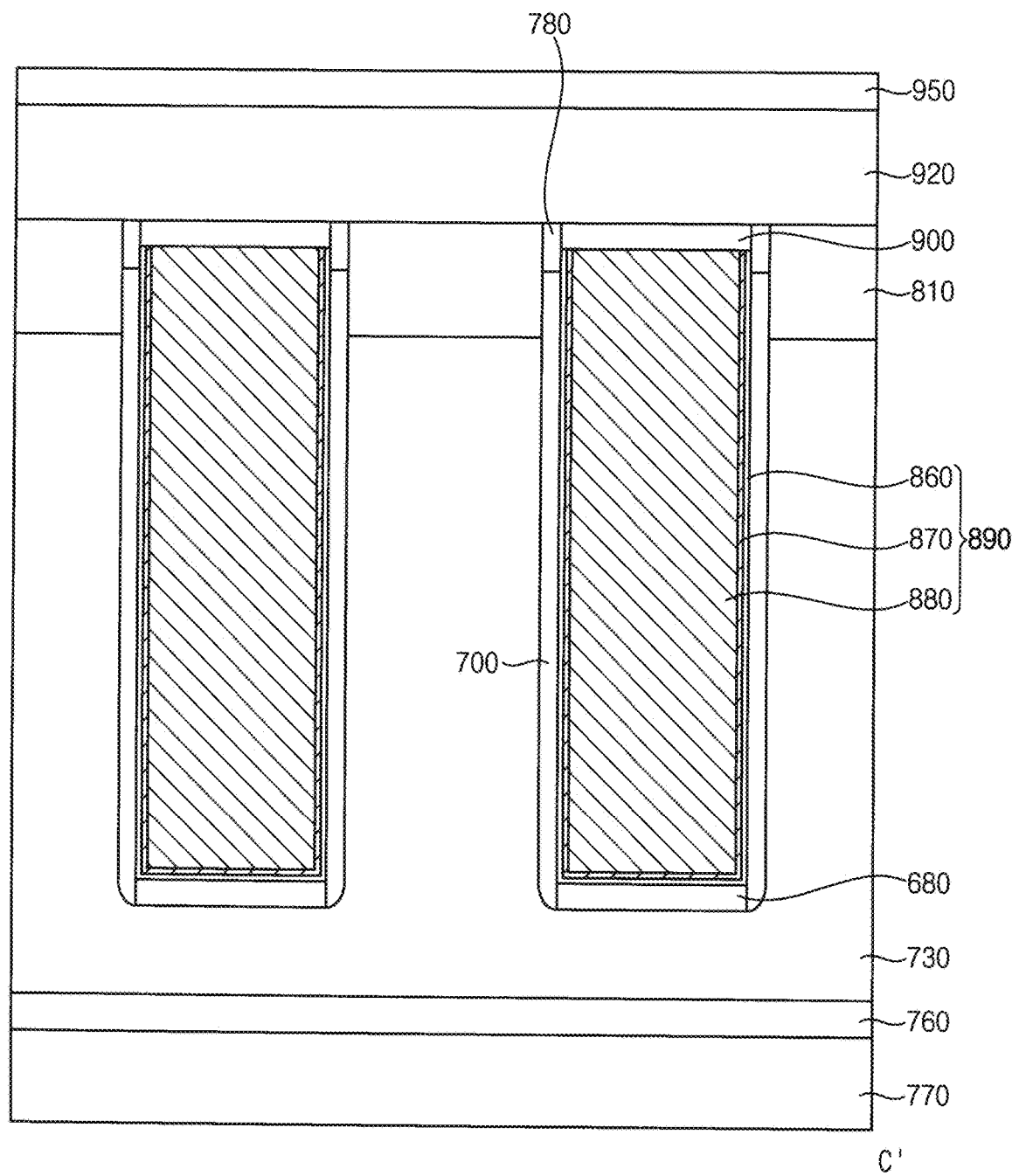

Referring to FIGS. 31 and 32, processes substantially the same as or similar to those illustrated with reference to FIGS. 15 to 19 may be performed.

Thus, first and second gate structures 892 and 894 may be formed to fill the third and first openings 840 and 820, respectively, and a third gate structure 890 may be also formed to fill the second opening 830 adjacent the first and third openings 820 and 840 in the second direction.

The first gate structure 892 may include a first interface pattern 852, a first gate insulation pattern 862, a first workfunction control pattern 872, and a first gate electrode 882, the second gate structure 894 may include a second interface pattern 854, a second gate insulation pattern 864, a second workfunction control pattern 874 and a second gate electrode 884, and the third gate structure 890 may include a third interface pattern (not shown), a third gate insulation pattern 860, a third workfunction control pattern 870 and a third gate electrode 880.

Upper portions of the second and third gate structures 894 and 890 may be removed to form a third recess, and a capping pattern 900 may be formed to fill the third recess. A connection plug 910 may be formed through the second source/drain layer 800, the first and second semiconductor lines 642 and 612, the division pattern 632, and an upper portion of the first source/drain layer 720.

A fourth insulating interlayer 920 may be formed on the third insulating interlayer 810, the connection plug 910, the capping pattern 900 and the second gate spacer 780, and a second wiring structure 940 may be formed through the fourth insulating interlayer 920 to contact the second source/drain layer 800. The second wiring structure 940 may include a second via 930 and a second wiring 935.

A fifth insulating interlayer 950 may be formed on the second wiring structure 940 and the fourth insulating interlayer 920 to complete the fabrication of the semiconductor device.

The semiconductor device may be substantially the same as or similar to that of FIGS. 18 and 19, except that each transistor in the semiconductor device may include only one channel and may not include the inner spacer, and thus repetitive descriptions on the characteristics thereof are omitted herein.

However, the semiconductor device of FIGS. 31 and 32 may include a first transistor having the first gate structure 892 and the second source/drain layers 800 at opposite sides in the first direction of the first gate structure 892, and a second transistor having the second gate structure 894 and the first source/drain layers 720 at opposite sides in the first direction of the second gate structure 894, and may be in symmetry with respect to the division pattern 632 in the third direction. The first and second source/drain layers 720 and 800 may be spaced apart from each other by the division pattern 632, and thus may not contact each other. However, the first and second source/drain layers 720 and 800 may be electrically connected to each other by the connection plug 910 extending at least partially through some of the first and second source/drain layers 720 and 800.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of inventive concepts. Accordingly, all such modifications are intended to be included within the scope of inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
a substrate;
a first transistor on the substrate,
the first transistor including a first gate structure, a first source/drain layer at each of opposite sides of the first gate structure, and first semiconductor patterns spaced apart from each other in a vertical direction that is substantially perpendicular to an upper surface of the substrate,
a distance in the vertical direction between an upper surface of the substrate and a lowermost surface of the first gate structure being less than a distance in the vertical direction between the upper surface of the substrate and a lowermost surface of the first source/drain layer, and
each of the first semiconductor patterns extending through the first gate structure and contacting the first source/drain layer;
a division pattern on the first transistor, the division pattern including an insulating material; and
a second transistor on the division pattern,
the second transistor including a second gate structure, a second source/drain layer at each of opposite sides of the second gate structure, and second semiconductor patterns spaced apart from each other in the vertical direction,
each of the second semiconductor patterns extending through the second gate structure and contacting the second source/drain layer, and
the second source/drain layer does not directly contact the first source/drain layer.

2. The semiconductor device of claim 1, wherein
the first source/drain layer includes silicon-germanium doped with p-type impurities; and
the second source/drain layer includes silicon doped with n-type impurities or silicon carbide doped with n-type impurities.

3. The semiconductor device of claim 1, wherein
each of the first source/drain layer and the second source/drain layer include silicon-germanium doped with p-type impurities, silicon doped with n-type impurities, or silicon carbide doped with n-type impurities.

4. The semiconductor device of claim 1, wherein
the first gate structure includes a first gate insulation pattern, a first workfunction control pattern, and a first gate electrode;
the second gate structure includes a second gate insulation pattern, a second workfunction control pattern, and a second gate electrode;
a material included in the first gate insulation pattern is substantially the a same material as a material included in the second gate insulation pattern;
a thickness of the first gate insulation pattern is substantially the same as a thickness of the second gate insulation pattern, a material included in the first workfunction control pattern and is substantially the same as a material included the second workfunction control pattern;
a thickness of the first workfunction control pattern is substantially equal to a thickness of the second workfunction control pattern;
a material included the first gate electrode is substantially the same as a material included in the second gate electrode; and
a thickness of the first gate electrode is substantially the same as a thickness of the second gate electrode.

5. The semiconductor device of claim 4, wherein
the second workfunction control pattern covers a sidewall and a lower surface of the second gate electrode, and the first workfunction control pattern covers a sidewall, a lower surface and an upper surfaces of the first gate electrode.

6. The semiconductor device of claim 1, wherein
the first gate structure includes a first gate insulation pattern, a first workfunction control pattern, and a first gate electrode;
the second gate structure includes a second gate insulation pattern, a second workfunction control pattern and a second gate electrode;
a material included in the first gate insulation pattern is substantially a same material as a material included in the second gate insulation pattern;
a thickness of the first workfunction control pattern is substantially equal to a thickness of the second workfunction control pattern; and
a material of first gate electrode is different than a material of the second gate electrode.

7. The semiconductor device of claim 1, further comprising:
a third gate structure on the substrate, wherein
the first source/drain layer is at each of opposite sides of the first gate structure in a first direction substantially parallel to the upper surface of the substrate;
the second source/drain layer is at each of opposite sides of the second gate structure in the first direction; and
the third gate structure is at opposite sides in a second direction of the first gate structure and the second gate structure;
the second direction is substantially parallel to the upper surface of the substrate and substantially perpendicular to the first direction; and
the third gate structure extends in the vertical direction.

8. The semiconductor device of claim 7, wherein
a lower surface of the third gate structure is substantially coplanar with a lower surface of the first gate structure; and
an upper surface of the third gate structure is substantially coplanar with an upper surface of the second gate structure.

9. The semiconductor device of claim 1, further comprising:
a third gate structure and a fourth gate structure on the substrate, wherein
the first source/drain layer is at each of opposite sides of the first gate structure in a first direction substantially parallel to the upper surface of the substrate; and
the second source/drain layer is at each of opposite sides of the second gate structure in the first direction;
the third gate structure is at each of opposite sides of the first gate structure in a second direction substantially parallel to the upper surface of the substrate and substantially perpendicular to the first direction;
the third gate structure contacts the first gate structure; and
the fourth gate structure is at each of opposite sides of the second gate structure in the second direction;
a material in the fourth gate structure is different than a material in the third gate structure; and
the fourth gate structure contacts the third gate structure.

10. The semiconductor device of claim 9, wherein
a lower surface of the third gate structure is substantially coplanar with a lower surface of the first gate structure; and
an upper surface of the fourth gate structure is substantially coplanar with an upper surface of the second gate structure.

11. The semiconductor device of claim 1, further comprising:
a connection plug extending through an upper portion of the first source/drain layer and the second source/drain layer, the connection plug electrically connecting the first source/drain layer and the second source/drain layer with each other.

12. The semiconductor device of claim 1, further comprising:
an inner spacer between a portion of the second gate structure and the second source/drain layer, the portion of the second gate structure being between the second semiconductor patterns, and the inner spacer including an insulating material.

13. A semiconductor device, comprising:
a substrate;
a gate structure on the substrate, the gate structure extending in a first direction substantially parallel to an upper surface of the substrate,
the first direction crossing a second direction,
the second direction being substantially parallel to the upper surface of the substrate,
the gate structure extending in a third direction and including a lower portion and an upper portion divided at a height over the substrate, and
the third direction being substantially perpendicular to the upper surface of the substrate;
a division pattern extending partially through the gate structure in the second direction on the substrate,
the division pattern including an insulating material,
the division pattern being arranged such that the lower portion and the upper portion of the gate structure contact each other at an area where the division pattern is not formed, and
the height over the substrate where the lower portion and the upper portion of the gate structure are divided corresponds to a central portion of the division pattern in the third direction;
a first source/drain layer at each of opposite sides in the second direction of the gate structure, the first source/drain layer being under the division pattern, and the lower portion of the gate structure and the first source/drain layer defining a first transistor, and a distance in a vertical direction between an upper surface of the substrate and a lowermost surface of the lower portion of the gate structure being less than a distance in the vertical direction between the upper surface of the substrate and a lowermost surface of the first source/drain layer; and
a second source/drain layer at each of opposite sides in the second direction of the gate structure, the second source/drain layer being over the division pattern,
the second source/drain layer and the first source/drain layer being spaced apart from each other by the division pattern in the third direction, and the upper portion of the gate structure and the second source/drain layer define a second transistor.

14. The semiconductor device of claim 13, further comprising:
a plurality of division patterns on the substrate that are spaced apart from each other in the first direction, wherein
the plurality of division patterns include the division pattern.

15. The semiconductor device of claim 13, further comprising:
- first semiconductor patterns spaced apart from each other in the third direction, each of the first semiconductor patterns extending through the lower portion of the gate structure to contact the first source/drain layer; and
- second semiconductor patterns spaced apart from each other in the third direction, each of the second semiconductor patterns extending through the upper portion of the gate structure to contact the second source/drain layer; and
- wherein the lower portion of the gate structure is between the first semiconductor patterns; and
- wherein the upper portion of the gate structure is between the second semiconductor patterns.

16. The semiconductor device of claim 13, wherein
the first source/drain layer includes silicon-germanium doped with p-type impurities; and
the second source/drain layer includes silicon doped with n-type impurities or silicon carbide doped with n-type impurities.

17. The semiconductor device of claim 13, wherein the first source/drain layer and the second source/drain layer each include silicon-germanium doped with p-type impurities, silicon doped with n-type impurities, or silicon carbide doped with n-type impurities.

18. The semiconductor device of claim 13, further comprising:
- a connection plug extending through an upper portion of the first source/drain layer and the second source/drain layer, wherein
- the connection plug electrically connects the first source/drain layer and the second source/drain layer to each other.

19. A semiconductor device, comprising:
- a substrate;
- a first insulating interlayer on the substrate;
- a gate structure on the first insulating interlayer, the gate structure extending in a first direction substantially parallel to an upper surface of the substrate;
- first source/drain layers on the first insulating interlayer, the first source/drain layers contacting lower portions of opposite sidewalls, respectively, in a second direction of the gate structure,
  - the second direction being substantially parallel to the upper surface of the substrate and crossing the first direction;
- a first wiring structure in the first insulating interlayer, the first wiring structure contacting one of the first source/drain layers;
- a division pattern extending through the gate structure to contact upper surfaces of the first source/drain layers;
- second source/drain layers contacting upper portions of opposite sidewalls, respectively, in the second direction of the gate structure;
- a connection plug extending through one of the second source/drain layers, the division pattern and one of the first source/drain layers;
- a second insulating interlayer on the gate structure, the connection plug and the second source/drain layers; and
- a second wiring structure in the second insulating interlayer, the second wiring structure contacting one of the second source/drain layers.

20. The semiconductor device of claim 19, wherein
a lower portion of the gate structure is under the division pattern and an upper portion of the gate structure is over the division patter;
the lower portion of the gate structure and the first source/drain layers define a first transistor,
the upper portion of the gate structure and the second source/drain layers define a second transistor;
the first transistor and the second transistor are symmetrical with respect to the division pattern in a third direction; and
the third direction is substantially perpendicular to the upper surface of the substrate.

* * * * *